US012633673B2

(12) United States Patent (10) Patent No.: US 12,633,673 B2
Kang (45) Date of Patent: May 19, 2026

(54) DOUBLE SLOT ARRAY ANTENNA DESIGN METHOD AND DOUBLE SLOT ARRAY ANTENNA DESIGNED THEREBY

(71) Applicant: HL KLEMOVE CORP., Incheon (KR)

(72) Inventor: Yun Su Kang, Gyeonggi-do (KR)

(73) Assignee: HL KLEMOVE CORP., Incheon (KR)

( * ) Notice: Subject to any disclaimer, the term of this patent is extended or adjusted under 35 U.S.C. 154(b) by 86 days.

(21) Appl. No.: 18/442,070

(22) Filed: Feb. 14, 2024

(65) Prior Publication Data

US 2024/0380123 A1     Nov. 14, 2024

(30) Foreign Application Priority Data

Feb. 16, 2023   (KR) ........................ 10-2023-0020870
Feb. 1, 2024    (KR) ........................ 10-2024-0015997

(51) Int. Cl.
*H01Q 21/00*      (2006.01)
*G06F 30/17*      (2020.01)
*H01Q 13/10*      (2006.01)

(52) U.S. Cl.
CPC .......... *H01Q 21/005* (2013.01); *G06F 30/17* (2020.01); *H01Q 13/10* (2013.01)

(58) Field of Classification Search
USPC .................................................. 343/771, 767
See application file for complete search history.

(56) References Cited

U.S. PATENT DOCUMENTS

| | | | | | |
|---|---|---|---|---|---|
| 7,808,439 | B2 * | 10/2010 | Yang | ...................... | H01Q 13/22 |
| | | | | | 343/770 |
| 10,944,184 | B2 | 3/2021 | Shi et al. | | |
| 2022/0302596 | A1 * | 9/2022 | Alexanian | .......... | H01Q 21/0031 |

FOREIGN PATENT DOCUMENTS

| | | | | | |
|---|---|---|---|---|---|
| CN | 105337047 | B | * 11/2018 | ............. | H01Q 21/00 |
| KR | 970010834 | B1 | * 7/1997 | ............. | H01Q 13/10 |
| KR | 10-2014-0083742 | | 7/2014 | | |
| KR | 10-2018-0129688 | | 12/2018 | | |
| KR | 102180722 | B1 | * 11/2020 | ........... | H01Q 21/064 |

OTHER PUBLICATIONS

Notice of Allowance dated Oct. 14, 2025 for Korean Patent Application No. 10-2024-0015997 and Its English translation provided by Applicant's foreign counsel.

* cited by examiner

*Primary Examiner* — Dimary S Lopez Cruz
*Assistant Examiner* — Brandon Sean Woods
(74) *Attorney, Agent, or Firm* — WOMBLE BOND DICKINSON (US) LLP

(57) ABSTRACT

A method for designing a double slot array antenna is disclosed, aiming to achieve a beam pattern similar to a target azimuth pattern and low side lobe levels. The method involves seven steps: (a) Setting the number of radiation elements and the required radiated power ratio; (b) modeling a unit cell simulation model; (c) setting the main slot offset distance; (d) deriving azimuth beam patterns for various cases by changing the sub-slot offset and length; (e) selecting a similar azimuth beam pattern by comparing patterns to a target pattern; (f) calculating the radiated power ratio for the selected case; and (g) finally, comparing the calculated power ratio with the set ratio to determine the final design value of each element.

13 Claims, 21 Drawing Sheets

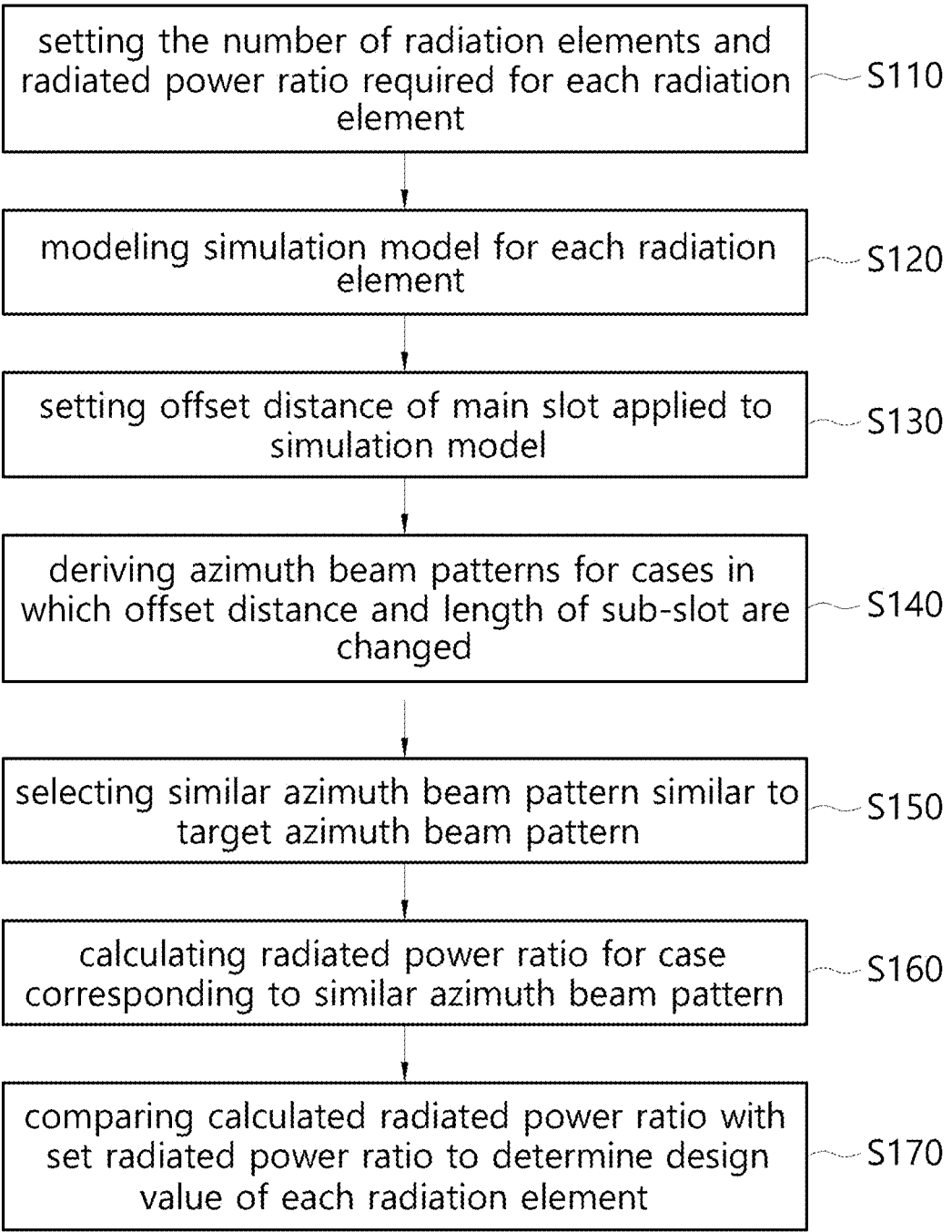

setting the number of radiation elements and radiated power ratio required for each radiation element ⌐∽ S110 modeling simulation model for each radiation element ⌐∽ S120 setting offset distance of main slot applied to simulation model ⌐∽ S130 deriving azimuth beam patterns for cases in which offset distance and length of sub-slot are changed ⌐∽ S140 selecting similar azimuth beam pattern similar to target azimuth beam pattern ⌐∽ S150 calculating radiated power ratio for case corresponding to similar azimuth beam pattern ⌐∽ S160 comparing calculated radiated power ratio with set radiated power ratio to determine design value of each radiation element ⌐∽ S170

FIG. 4

Main slot offset : -0.15mm, Sub Slot offset: +0.32 mm, Sub Slot length: 0.54 $\lambda_0$ Main slot offset : -0.15mm, Sub Slot offset: +0.62 mm, Sub Slot length: 0.79 $\lambda_0$

FIG. 10

FIG. 19 Radiated Power Ratio (%)

FIG. 20     Radiated Power Ratio (%)

DOUBLE SLOT ARRAY ANTENNA DESIGN METHOD AND DOUBLE SLOT ARRAY ANTENNA DESIGNED THEREBY

CROSS-REFERENCE TO RELATED APPLICATION

This application claims priority to and the benefit of Korean Patent Provisional Application No. 10-2023-0020870, filed on Feb. 16, 2023, and Korean Patent Application No. 10-2024-0015997, filed on Feb. 1, 2024, the disclosures of which is incorporated herein by reference in its entirety.

FIELD

The present disclosure relates to a method for designing a double slot array antenna and a double slot array antenna designed thereby.

BACKGROUND

A radar for a vehicle is a device that radiates an electromagnetic wave signal from an antenna, receives an electromagnetic wave returning from a target on a road (a vehicle, a motorcycle, a person, etc.), and determines the distance, speed, and angle of the target.

At this time, the antenna is a device that radiates electromagnetic waves, and the shape and gain of the beam are closely related to the condition of detecting the target.

Since the antenna of the corner radar for the vehicle is mounted in an inclined state at the corner of the vehicle, the antenna beam is radiated in an inclined form with respect to the longitudinal direction of the vehicle. In other words, the antenna of the corner radar for the vehicle is radiated in an inclined form with respect to the entire length of the vehicle.

In this case, when the radiation element of the antenna has a single slot shape, it has an azimuth beam pattern that uniformly radiates electromagnetic waves in the observation angle range of the antenna, but when the antenna has a double slot shape, it may have a so-called inclined azimuth beam pattern that radiates a relatively strong beam in a specific direction in the observation angle range of the antenna.

When the direction in which the radar is mounted is inclined to the front or rear of the vehicle, the radar with the inclined beam may radiate electromagnetic waves further away from the entire length. This may quickly respond to the dangerous situation by detecting the target at a greater distance. In addition, since the function of detecting the target in the entire width direction is required in the front or corner of the vehicle, the radar used is required to have a wide-angle beam.

It is not easy to design an antenna device with an inclined wide-angle beam due to various variables, and it is urgent to develop a technology for easy and effective design.

SUMMARY

Technical Problem

The present disclosure is to solve the above problems, and it is an object of the present disclosure to provide a design method for easily and effectively designing a double slot array antenna having a desired azimuth beam pattern and elevation angle beam pattern.

Another object of the present disclosure is to provide a design method for easily and effectively designing a double slot array antenna having a desired azimuth beam pattern.

The technical problems of the present disclosure are not limited to the above-mentioned technical problems, and other technical problems not mentioned may be clearly understood by those skilled in the art to which the present disclosure pertains from the following description.

Technical Solution

According to an aspect of the present disclosure, there is provided a method for designing a double slot array antenna, includes steps of: (a) setting the number of radiation elements of a double slot structure arranged in a waveguide of an array antenna to be designed, and setting a radiated power ratio required for each of the radiation elements; (b) modeling a simulation model for each of the radiation elements; (c) setting an offset distance of a main slot of each of the radiation elements applied to the simulation model; (d) deriving azimuth beam patterns for cases in which an offset distance and a length of a sub-slot of each of the radiation elements applied to the simulation model are changed; (e) selecting a similar azimuth beam pattern similar to a target azimuth beam pattern among the derived azimuth beam patterns; (f) calculating a radiated power ratio for the case corresponding to the similar azimuth beam pattern; and (g) comparing the calculated radiated power ratio with the set radiated power ratio to determine a design value of each of the radiation elements.

In this case, a length of the main slot applied to the simulation model may be determined as half of the wavelength of an electromagnetic wave radiated into air.

Meanwhile, the main slot and the sub-slot of each of the radiation elements may be disposed in a first region and a second region facing each other with a center line in an extension direction of the waveguide interposed, respectively, or may be disposed in the second region and the first region.

In this case, the simulation model for each of the radiation elements may be modeled in response to an arrangement form between the main slot and the sub-slot of each of the radiation elements.

In this case, in the step (b), the simulation model may be modeled in a form in which the periphery is grounded.

Meanwhile, in the step (e), the similar azimuth beam pattern may be selected by using a root mean square error between the target azimuth beam pattern and the derived azimuth beam patterns.

Meanwhile, the step (e) may include calculating root mean square error values of the derived azimuth beam patterns with respect to the target azimuth beam pattern; deriving a minimum value among the calculated root mean square error values; and selecting the azimuth beam pattern corresponding to the minimum value as the similar azimuth beam pattern when the minimum value is equal to or less than a set value, and returning to the step (d) when the minimum value exceeds the set value.

In this case, the set value may be 0.5.

Meanwhile, in step (g), when a difference between the calculated radiated power ratio and the set radiated power ratio is within an error range, an offset distance value of the main slot, an offset distance value of the sub-slot, and a length value of the sub-slot applied to the case corresponding to the similar azimuth beam pattern may be determined as a design value of each of the radiation elements, and returning to the step (c) when the difference between the calculated radiated power ratio and the set radiated power ratio is out of the error range.

In this case, the error range may be 0.001 or less.

According to another aspect of the present disclosure, there may be provided a method for designing a double slot array antenna, including: (J) deriving a design curve for antenna design; (K) setting the number of radiation elements to be designed having a double slot structure of an array antenna to be designed, and setting a radiated power ratio required for each radiation element to be designed; and (L) determining a design value of each radiation element to be designed based on the set radiated power ratio and the design curve for antenna design.

In this case, the design curve for antenna design may be derived based on data acquired through the design method according to the previous embodiment.

In this case, in the step (L), the radiated power ratio required for each radiation element to be designed may be substituted into the design curve for antenna design, and the matched offset distance value of the main slot, the offset distance value of the sub slot, and the length value of the sub slot may be determined as the design value of each radiation element to be designed.

According to another aspect of the present disclosure, a double slot array antenna designed by any one of the design methods may be provided.

Advantageous Effects

According to the above configuration, the design method according to one aspect of the present disclosure can easily and effectively design an array antenna having a beam pattern similar to a target azimuth beam pattern desired by the designer and having a low level near the side lobe of the entire elevation angle beam pattern emitted by the radiation elements.

The design method according to another aspect of the present disclosure can easily and effectively design an array antenna having a beam pattern similar to a target azimuth beam pattern desired by the designer and having a low level near the side lobe of the entire elevation angle beam pattern emitted by the radiation elements.

The design method according to still another aspect of the present disclosure can easily and effectively design an array antenna having a beam pattern similar to a target azimuth beam pattern desired by the designer.

It should be understood that the effects of the present disclosure are not limited to the above effects, and include all effects that can be inferred from the configuration of the detailed description of the present disclosure or the invention described in the claims.

BRIEF DESCRIPTION OF THE DRAWINGS

FIG. 4 is a flowchart of a double slot array antenna design method according to an embodiment of the present disclosure.

FIGS. 9 to 11 are diagrams showing azimuth beam patterns of cases in which an offset distance of the sub-slot and a length of the sub-slot are different while an offset distance of the main slot is set as a specific value.

DETAILED DESCRIPTION

Figure 1:
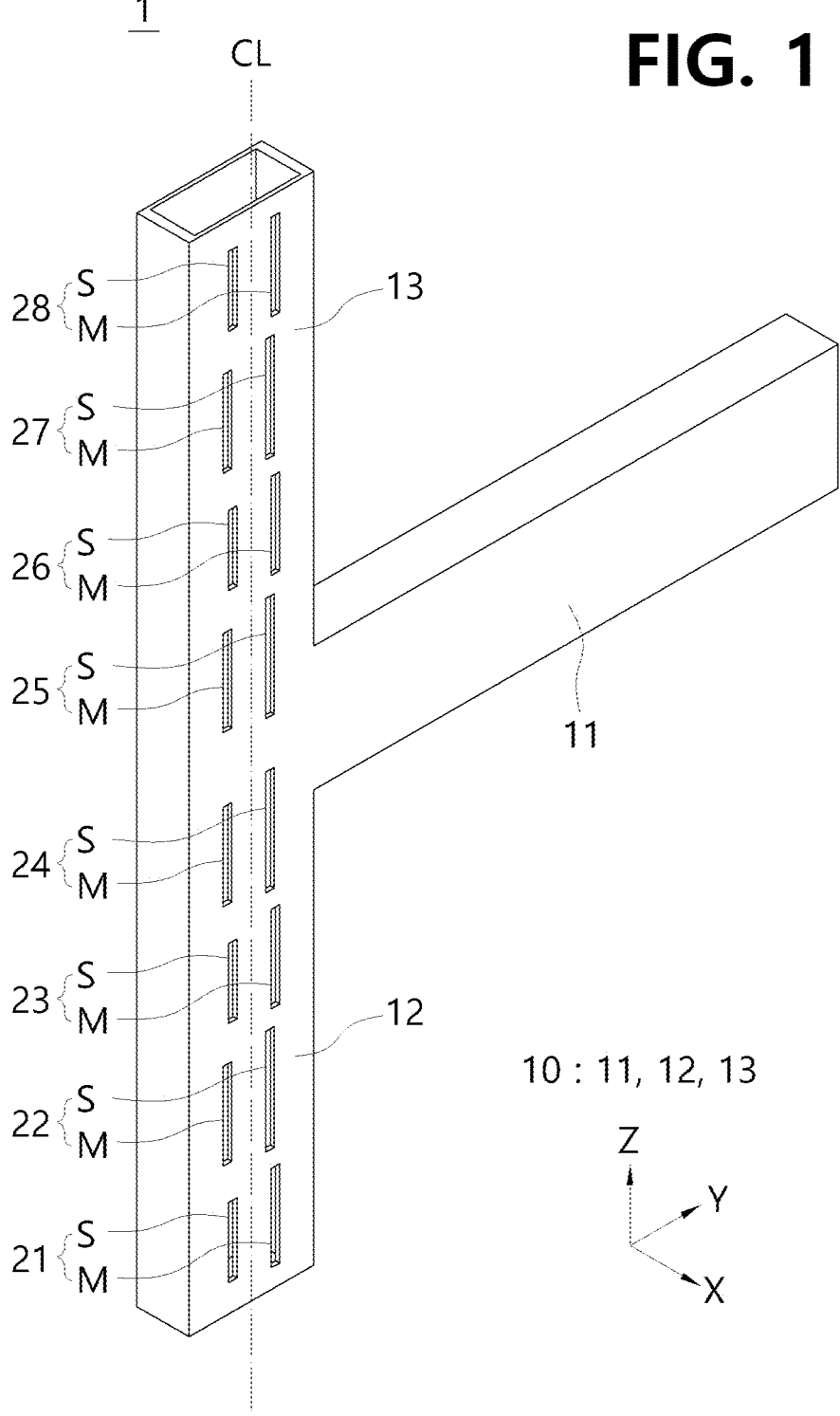
FIG. 1 is a diagram schematically showing an array antenna to be designed by applying a double slot array antenna design method according to an embodiment of the present disclosure.

Hereinafter, embodiments of the present disclosure will be described in detail with reference to the accompanying drawings so that those skilled in the art may easily practice the present disclosure. The present disclosure may be implemented in various different forms and is not limited to the embodiments described herein. In order to clearly describe the present disclosure, parts not related to the description are omitted in the drawings, and the same or similar components are referred to by the same reference numerals throughout the specification.

The words and terms used in the specification and claims should not be interpreted as limited to ordinary or dictionary meanings, but should be interpreted as meanings and concepts corresponding to the technical idea of the present disclosure according to the principle that the inventor may define the terms and concepts in order to describe their invention in the best way.

Therefore, the embodiments and structures illustrated in the drawings described in this specification correspond to preferred embodiments of the present disclosure and do not all represent the technical idea of the present disclosure, so the corresponding structures may have various equivalents and modifications to replace them at the time of filing the present disclosure.

In this specification, it should be understood that the terms such as "include" or "have" are intended to describe the presence of the features, numbers, steps, operations, components, parts or combinations described in the specification, and do not exclude the presence or addition of one or more other features, numbers, steps, operations, components, parts or combinations thereof.

The fact that a component is in the "front," "rear," "upper," or "lower" of another component includes not only the arrangement of the "front," "rear," "upper," or "lower" in immediate contact with the other component, but also the case where another component is arranged in the middle. In addition, the fact that a component is "connected" to another component includes not only the case of being directly connected to each other but also the case of being indirectly connected to each other, unless otherwise specified.

Hereinafter, a method for designing a double slot array antenna according to an embodiment of the present disclosure will be described with reference to the drawings.

FIG. 1 is a diagram schematically showing an array antenna to be designed by applying a double slot array antenna design method according to an embodiment of the present disclosure.

Referring to FIG. 1, the array antenna 1 to be designed by applying the design method according to the present embodiment is an antenna for corner radar of a vehicle and may be attached to the front corner or rear corner of the vehicle.

In FIG. 1, the +x direction represents the front of the array antenna 1 or a waveguide 10, and the −z direction represents the direction toward the ground.

The array antenna 1 shown in FIG. 1 is located at the front corner or rear corner of the vehicle and is installed on an antenna installation surface that is inclined at a predetermined angle with respect to the longitudinal direction of the vehicle. For example, the antenna installation surface may be located at the front corner of the vehicle and may be inclined at 60 degrees with respect to the longitudinal direction of the vehicle.

As seen in FIG. 1, the YZ plane where the array antenna 1 or the waveguide 10 is placed is formed in parallel with the antenna installation surface.

The array antenna 1 has a predetermined azimuth beam pattern and an elevation angle beam pattern, and when using the design method according to the present embodiment, it is possible to easily and effectively design an array antenna having the azimuth beam pattern and the elevation angle beam pattern desired by the designer.

Here, the azimuth beam pattern desired by the designer may mean a target azimuth beam pattern described below, and the elevation angle beam pattern desired by the designer may mean an elevation angle beam pattern having a relatively low level in the side lobe described below.

In the present embodiment, the array antenna 1 to be designed may be a center feeding antenna.

For example, the waveguide 10 of the array antenna 1 to be designed may have a T-shape. The waveguide 10 may include a central portion 11 extending in one direction, and a first branch portion 12 and a second branch portion 13 branched from one side of the central portion 11 and extending in one direction and the other direction perpendicular to the extension direction of the central portion 11.

The central portion 11, the first branch portion 12, and the second branch portion 13 are placed on the same plane.

For example, the array antenna 1 to be designed is an antenna attached to the corner of a vehicle, and as shown in FIG. 1, the central portion 11 extends in the +Y direction, the first branch portion 12 extends in the +Z direction, and the second branch portion 13 extends in the −Z direction.

However, in FIG. 1, the central portion 11 is shown as extending in the +Y axis direction with respect to the first branch portion 120 and the second branch portion 130, but this is merely an example, and alternatively, the central portion 11 may extend in the −Y axis direction or the −X axis direction with respect to the first branch portion 120 and the second branch portion 130.

For reference, the Z-axis shown in FIG. 1 may be orthogonal to the ground or obliquely placed according to the shape and structure of the antenna installation surface provided at the corner of the vehicle.

The electromagnetic waves fed from one end of the central portion 11 and moving along the inside of the central portion 11 may branch off from the other end of the central portion 11 and move along the first branch portion 12 and the second branch portion 13.

The first branch portion 12 and the second branch portion 13 have a symmetrical structure about the central portion 11. The first branch portion 12 and the second branch portion 13 are formed to extend in a line. In other words, a center line CL in the extension direction of the first branch portion 12 and a center line CL in the extension direction of the second branch portion 13 are the same.

A plurality of radiation elements 21, 22, 23, 24, 25, 26, 27, and 28 of a double slot structure are arranged in the first branch portion 12 and the second branch portion 13, respectively. Each of the radiation elements 21, 22, 23, 24, 25, 26, 27, and 28 includes a main slot M and a sub-slot S.

The main slot M and the sub-slot S constituting each of the radiation elements 21, 22, 23, 24, 25, 26, 27, and 28 are spaced apart from each other around the center line CL in the extension direction of the first branch portion 12 and the second branch portion 13.

For example, FIG. 1 shows eight radiation elements 21, 22, 23, 24, 25, 26, 27, and 28. For convenience, when the radiation elements 21, 22, 23, 24, 25, 26, 27, and 28 are sequentially numbered from below to above in FIG. 1, the radiation elements 21, 22, 23, 24, 25, 26, 27, and 28 may be named as the first to eighth radiation elements 21 to 28.

Figure 2:
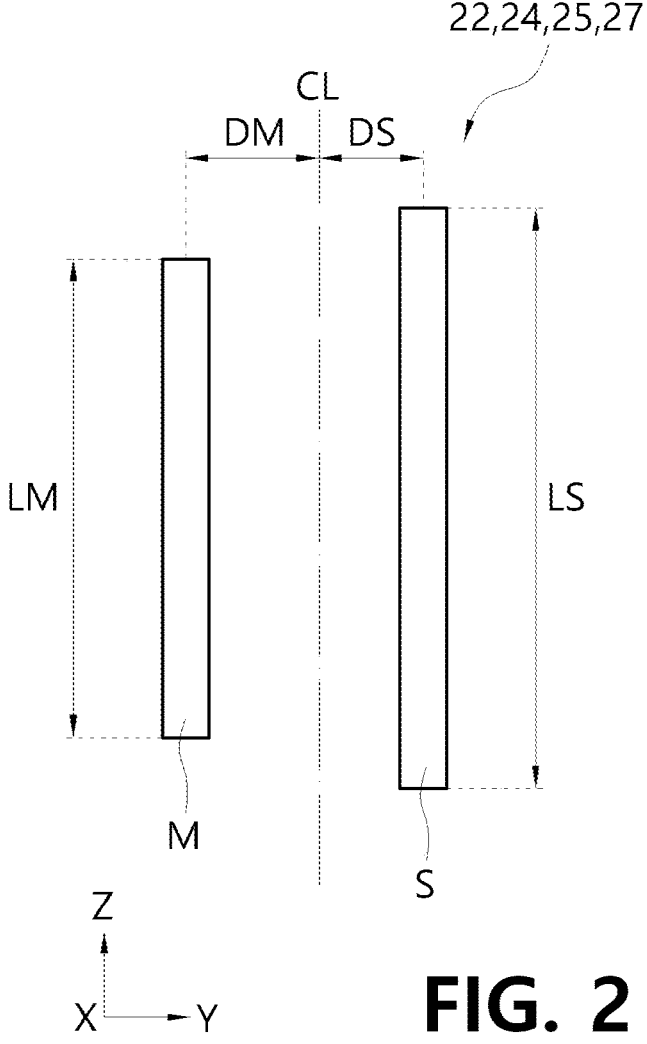
FIGS. 2 and 3 are enlarged views of the radiation elements of the double slot structure shown in FIG. 1 by classifying them according to shapes.
Figure 3:
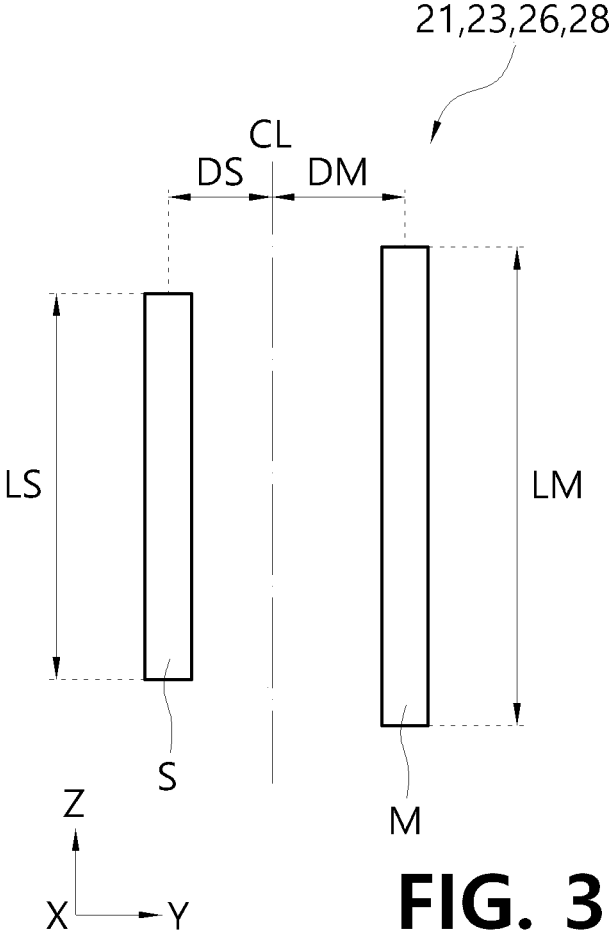

FIGS. 2 and 3 are enlarged views of the radiation elements of the double slot structure shown in FIG. 1 by classifying them according to shapes.

Referring to FIGS. 1 and 2, the second radiation element 22, the fourth radiation element 24, the fifth radiation element 25, and the seventh radiation element 27 have an arrangement form (hereinafter referred to as a first arrangement form) in which the main slot M and the sub-slot S are located in a first region and a second region facing each other with the center line CL in the extension direction of the first branch 12 and the second branch 13 interposed, respectively. For example, the first region and the second region may be a left region and a right region of the center line CL, respectively, when shown in FIGS. 1 and 2.

Referring to FIGS. 1 and 3, the first radiation element 21, the third radiation element 23, the sixth radiation element 26, and the eighth radiation element 28 have an arrangement form (hereinafter, referred to as a second arrangement form) in which the main slot M and the sub-slot S are located in the second region and the first region facing each other with the center line CL in the extension direction of the first branch 12 and the second branch 13 interposed, respectively. For example, the second region and the first region may be a right region and a left region of the center line CL, respectively, when shown in FIG. 1.

Referring to FIGS. 1 to 3, the distance between the main slot M constituting the first to eighth radiation elements 21 to 28 and the center line CL of the first branch 12 and the second branch 13, which are part of the waveguide 10, is referred to as the offset distance DM of the main slot M.

And the distance between the sub-slot S constituting the first to eighth radiation elements 21 to 28 and the center line CL is referred to as the offset distance DS of the sub-slot S.

The main slots M constituting the first to eighth radiation elements 21 to 28 extend in the extension direction of the first branch portion 12 and the second branch portion 13 which are part of the waveguide 10, respectively. In FIGS. 2 and 3, the length of the main slots M is represented by 'LM'.

The sub-slots S constituting the first to eighth radiation elements 21 to 28 extend in the direction of extension of the first branch portion 12 and the second branch portion 13, which are part of the waveguide 10. In FIGS. 2 and 3, the length of the sub-slot S is represented by 'LS'.

Referring to FIG. 1, in the first branch 12, four radiation elements 21, 22, 23, and 24 are arranged in the extension direction of the first branch portion 12, and in the second branch 13, the remaining four radiation elements 25, 26, 27, and 28 are arranged in the extension direction of the second branch portion 13. At this time, the first branch portion 12 and the second branch portion 13 are parts of the T-shaped waveguide 10 where electromagnetic waves are substantially radiated.

The main slots M constituting the radiation elements 21, 22, 23, and 24 disposed in the first branch portion 12 are arranged in a zigzag shape with respect to the center line CL in the extension direction of the first branch portion 12.

In addition, the main slots M constituting the radiation elements 25, 26, 27, and 28 disposed in the second branch 13 are arranged in a zigzag shape with respect to the center line CL in the extension direction of the second branch portion 13.

The sub-slots S constituting the radiation elements 21, 22, 23, and 24 disposed in the first branch portion 12 are arranged in a zigzag shape with respect to the center line CL in the extension direction of the first branch portion 12.

The sub-slots C constituting the radiation elements 25, 26, 27, and 28 disposed in the second branch portion 13 are arranged in a zigzag shape with respect to the center line CL in the extension direction of the second branch potion 13.

The length LM of the main slots M is determined as the half-wavelength of the wavelength $\lambda_o$ of the electromagnetic wave radiated into the air from the main slots M or the radiation elements 21, 22, 23, 24, 25, 26, 27, and 28. The spacing between the first branch potion 12 and the second branch portion 13 of the main slots M in the extension direction may be determined to be about half-wavelength of the wavelength in the tube of the waveguide 10.

The wavelength $\lambda_o$ of the electromagnetic wave radiated into the air and the wavelength in the tube of the waveguide 10 are determined by the operating frequency of the array antenna 1 to be designed. For example, the operating frequency may be determined from 76 GHz to 81 GHz, and preferably 76.5 GHz.

The operating frequency of the array antenna 1 to be designed may be predetermined at the beginning of the design or before the design. Therefore, the length LM and the spacing of the main slots M constituting the radiation elements 21, 22, 23, 24, 25, 26, 27, and 28 may be determined in advance at the beginning of the design or before the design when the operating frequency is determined.

Therefore, the length LM and the spacing of the main slots M constituting the radiation elements 21, 22, 23, 24, 25, 26, 27, and 28 may be treated as constant in an array antenna design process described below.

Depending on the offset distance DM of the main slots M constituting each radiation element 21, 22, 23, 24, 25, 26, 27, and 28 and the offset distance DS and the length LS of the sub-slot S constituting each radiation element 21, 22, 23, 24, 25, 26, 27, and 28, an azimuth beam pattern and an elevation angle beam pattern radiated from each radiation element 21, 22, 23, 24, 25, 26, 27, and 28 as well as an azimuth beam pattern and an elevation angle beam pattern radiated from the entire radiation element 21, 22, 23, 24, 25, 26, 27, and 28. Therefore, the offset distance DM of the main slot M of each radiation element 21, 22, 23, 24, 25, 26, 27, and 28 and the offset distance DS and the length LS of the sub-slot S may be treated as variables in the array antenna design process described below.

FIG. 4 is a flowchart of a double slot array antenna design method according to an embodiment of the present disclosure. Hereinafter, the double slot array antenna design method M1 according to the present embodiment will be described with reference to FIGS. 1 and 4.

The method for designing an array antenna having double slot M1 according to the present embodiment includes a step S110 of setting the number of radiation elements of an array antenna to be designed, and a radiated power ratio required for each of the radiation elements, a step S120 of modeling a simulation model for each of the radiation elements, a step S130 of setting an offset distance of a main slot of each of the radiation elements applied to the simulation model, a step S140 of deriving azimuth beam patterns for cases in which an offset distance and a length of a sub-slot of each of the radiation elements applied to the simulation model are changed, a step S150 of selecting a similar azimuth beam pattern similar to a target azimuth beam pattern among the derived azimuth beam patterns, a step S160 of calculating a radiated power ratio for the case corresponding to the similar azimuth beam pattern, and a step S170 of comparing the calculated radiated power ratio with the set radiated power ratio to determine a design value of each of the radiation elements.

First, in step S110, the number of radiation elements 21, 22, 23, 24, 25, 26, 27, and 28 having the double slot structure arranged along the waveguide 10 of the array antenna 1 to be designed is set.

For example, the number of the radiation elements 21, 22, 23, 24, 25, 26, 27, and 28 arranged along the waveguide 10 may be set to 8 as shown in FIG. 1. However, the number of radiation elements constituting the array antenna may be set to between 4 and 50 when impedance matching is not applied, and there is no limit to the number when impedance matching is applied.

For example, the waveguide 10 of the array antenna 1 to be designed may have, for example, a T-shape having a center feeding method. In this case, four radiation elements 21, 22, 23, and 24 among the eight radiation elements 21, 22, 23, 24, 25, 26, 27, and 28 may be formed in the first branch portion 12, and the remaining four radiation elements 25, 26, 27, and 28 may be formed in the second branch portion 13.

In step S110, the radiated power ratio required for each radiation element 21, 22, 23, 24, 25, 26, 27, and 28 is set.

Here, the radiated power ratio represents the ratio of the power $P_{radiated}$ radiated through the radiation element to the power $P_{in}$ introduced toward the radiation element before radiating the electromagnetic wave from the radiation element, and may be calculated by a known method. This will be described later.

For example, the fourth radiation element 24 and the fifth radiation element 25 located at the center of the array among the eight radiation elements 21, 22, 23, 24, 25, 26, 27, and 28 arranged may be set to have the largest radiated power ratio, and the first radiation element 21 and the eighth radiation element 28 farthest from the center of the array among the eight radiation elements 21, 22, 23, 24, 25, 26, 27, and 28 arranged may be set to have the smallest radiated power ratio.

In other words, the eight radiation elements 21, 22, 23, 24, 25, 26, 27, and 28 arranged may be set to have a smaller radiated power ratio as the distance from the center of the array increases.

Figure 5:
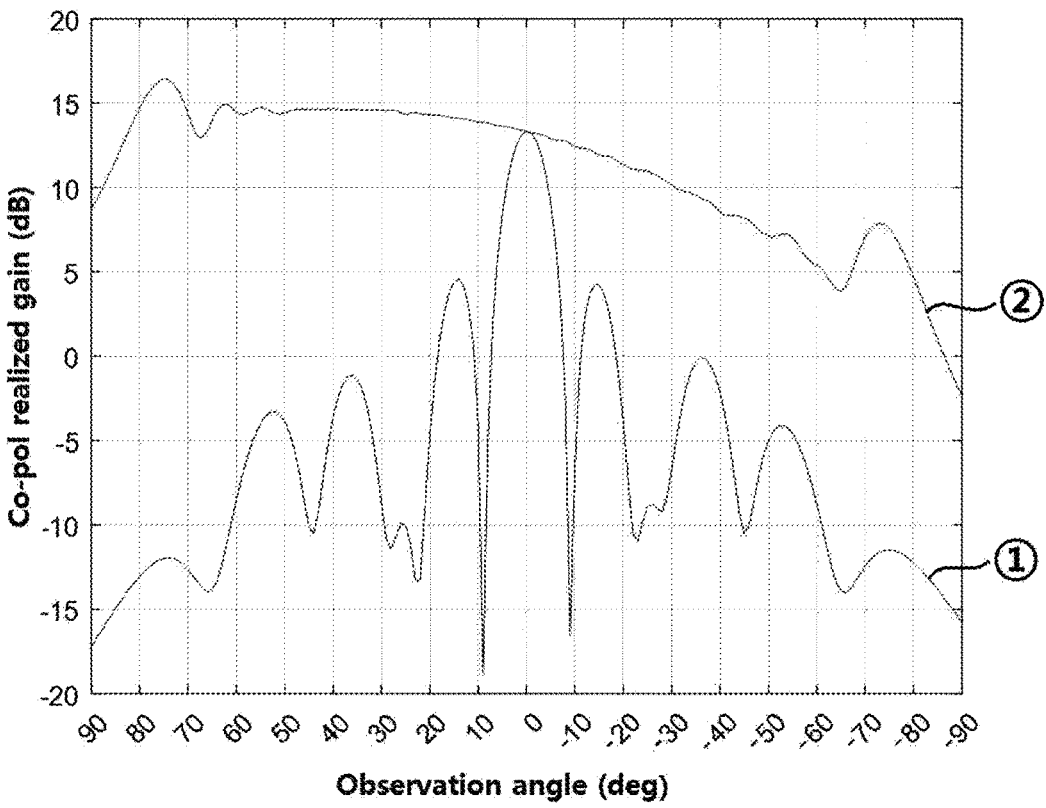
FIG. 5 is a diagram showing an example of an elevation angle beam pattern and an azimuth beam pattern according to the radiated power ratio of a plurality of radiation elements.
Figure 6:
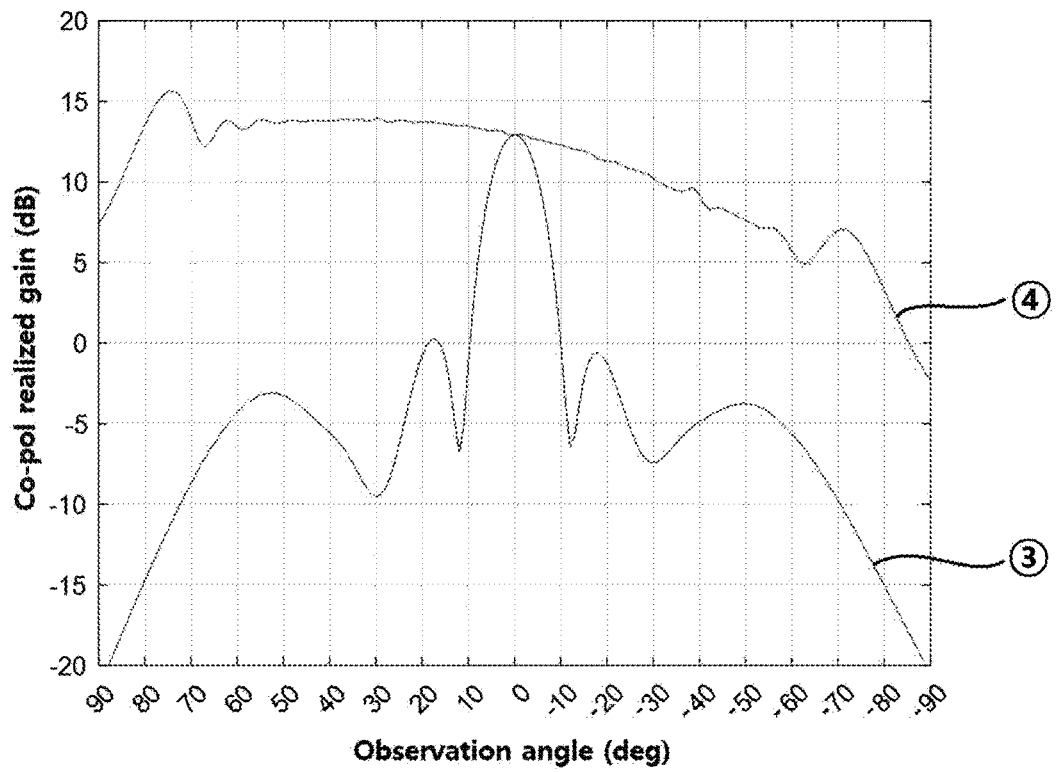
FIG. 6 is a diagram showing another example of an elevation angle beam pattern and an azimuth beam pattern according to the radiated power ratio of a plurality of radiation elements.

In this regard, FIG. 5 is a diagram showing an example of an elevation angle beam pattern and an azimuth beam pattern according to the radiated power ratio of a plurality of radiation elements, and FIG. 6 is a diagram showing another example of an elevation angle beam pattern and an azimuth beam pattern according to the radiated power ratio of a plurality of radiation elements.

For reference, FIGS. 5 and 6 are results derived through a numerical analysis method to analyze the tendency of the entire elevation angle and azimuth beam patterns according to the radiated power ratio of a plurality of radiation elements having a double slot structure. In the graphs shown in FIGS. 5 and 6, the vertical axis represents gain, and the horizontal axis represents observation angle. Here, the observation angle means the elevation angle or the azimuth angle.

FIG. 5 relates to a case in which the radiation elements arranged in the waveguide are designed to have the same or similar radiated power ratio. More specifically, the radiation elements applied in FIG. 5 are eight, and the eight radiation elements are designed to have the same radiated power ratio of approximately 0.125.

In FIG. 5, the entire elevation angle beam pattern ① and the entire azimuth beam pattern ② emitted from the radiation elements designed to have the same or similar radiated power ratio are shown.

In FIG. 6, the radiation elements arranged in the waveguide are designed to have a lower radiated power ratio as they are farther from the center of the array. More specifically, there are eight radiation elements applied in FIG. 6, and the eight radiation elements are designed such that the two radiating elements farthest from the center of the array had a radiated power ratio of approximately 0.022, the two radiating elements second farthest from the center of the array had a radiated power ratio of approximately 0.131, and the two radiating elements third farthest from the center of the array had a radiated power ratio of approximately 0.145, and the two radiating elements closest to the center of the array had a radiated power ratio of approximately 0.202. FIG. 6 shows the entire elevation angle beam pattern ③ and the entire azimuth beam pattern ④ emitted from the radiation elements designed to have a lower radiated power ratio as the distance from the center of the array increases. For reference, the radiation elements applied in FIGS. 5 and 6 have different elevation angle beam patterns ① and ③ in terms of the elevation angle, but designed to have the same or very similar azimuth beam patterns ② and ④ in terms of the azimuth angle. Referring to FIG. 5, it may be confirmed that when the radiation elements are designed to have the same or similar radiated power ratio, the gain level is generated high in the side lobe of the entire elevation angle beam pattern ① emitted from the radiation elements. In FIG. 5, the side lobe of the elevation angle beam pattern ① appear at approximately −20° and +20°.

Therefore, when the arranged radiation elements have the same or similar radiated power ratio, the clutter signal received by the vehicle radar on the ground increases, thereby increasing the mis-sensing rate of the radar.

Referring to FIG. 6, it may be confirmed that when the radiation elements have a lower radiated power ratio as they far from the center of the array, the level of the side lobe of the entire elevation angle beam pattern emitted from the radiation elements is significantly lower than that of FIG. 5. In FIG. 5, the side lobe of the elevation angle beam pattern 3 appear at approximately −20° and +20°.

In this case, the clutter signal received by the vehicle radar on the ground may decrease, thereby decreasing the mis-sensing rate of the radar.

The designer sets the required radiated power ratio for each of the eight radiation elements 21, 22, 23, 24, 25, 26, 27, and 28 to be designed, in consideration of the tendency of the retire elevation angle beam pattern according to the radiated power ratio of the radiation elements shown in FIGS. 5 and 6.

For example, the arranged eight radiation elements 21, 22, 23, 24, 25, 26, 27, and 28 may be set to have a smaller radiated power ratio as the distance from the center of the array increases.

For reference, the radiated power ratio is proportional to the radiation amount of electromagnetic waves emitted from the radiation elements 21, 22, 23, 24, 25, 26, 27, and 28. And the radiation amount of the radiation elements 21, 22, 23, 24, 25, 26, 27, and 28 is determined by the offset distance of the main slots M constituting the radiation elements 21, 22, 23, 24, 25, 26, 27, and 28.

In step S120, the simulation model for each of the radiation elements 21, 22, 23, 24, 25, 26, 27, and 28 is modeled. The simulation model has a unit cell structure.

Figure 7:
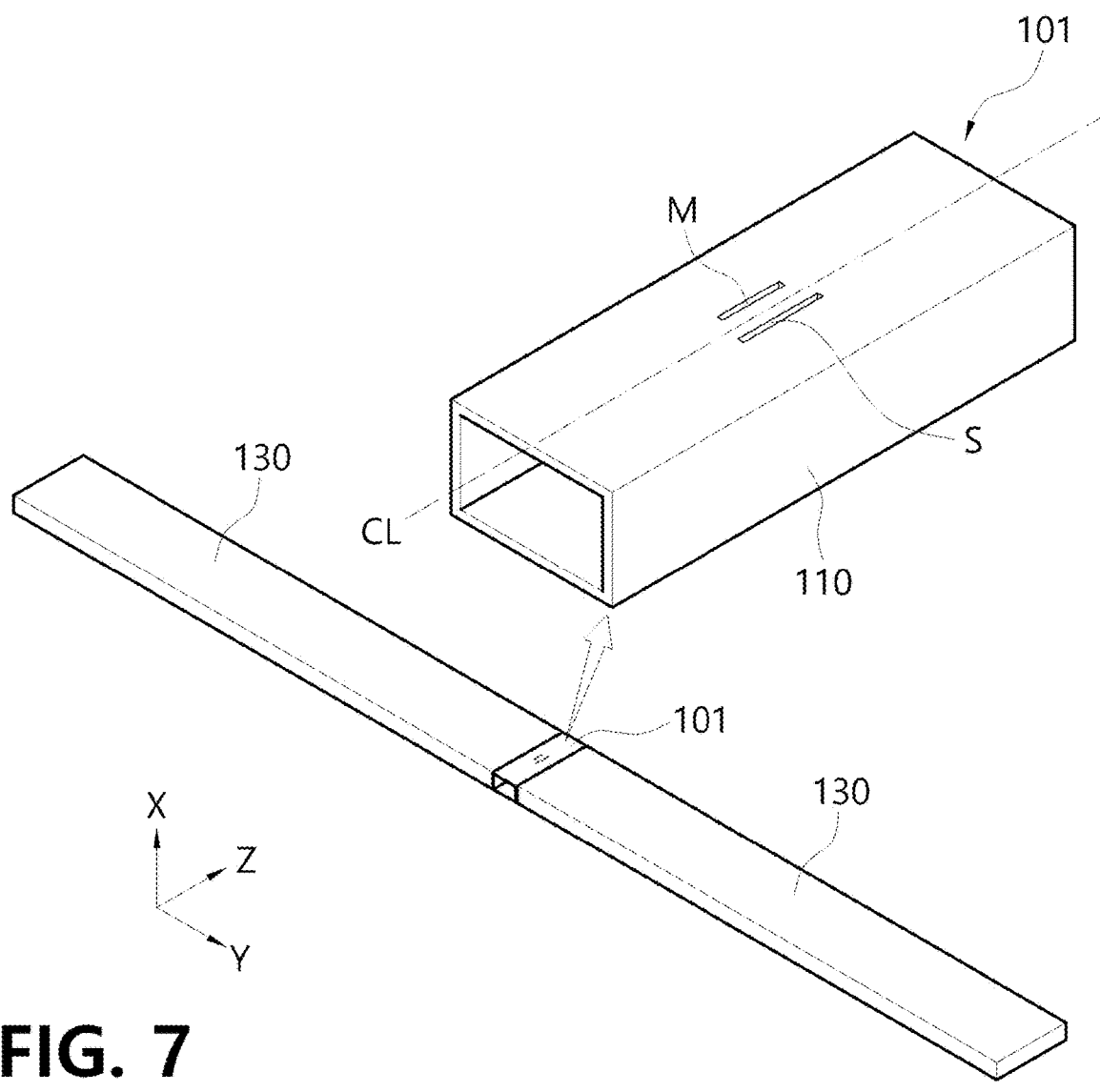
FIG. 7 is a diagram showing an example of a simulation model having a unit cell structure for the radiation elements.
Figure 8:
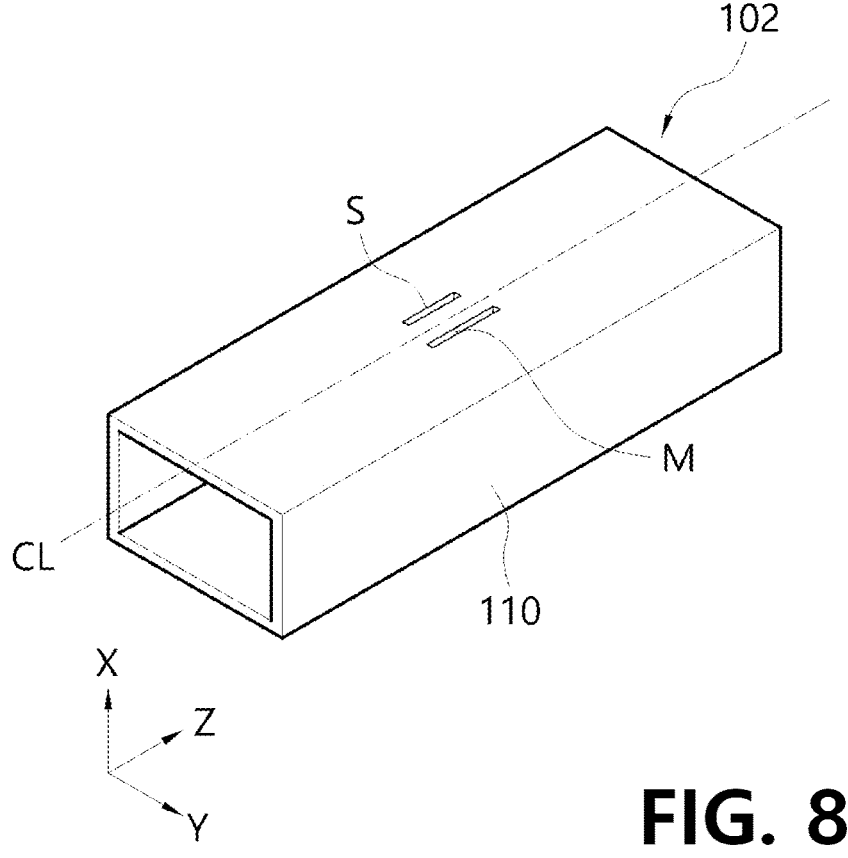
FIG. 8 is a diagram showing another example of a simulation model having a unit cell structure for the radiation elements.

FIG. 7 is a diagram showing an example of a simulation model for the radiation elements, and FIG. 8 is a diagram showing another example of a simulation model for the radiation elements.

For convenience, the simulation model shown in FIG. 7 is referred to as the first simulation model 101 and the simulation model shown in FIG. 8 is referred to as the second simulation model 102.

Referring to FIGS. 1, 4, 7 and 8, the first simulation model 101 and the second simulation model 102 model the radiation elements 21, 22, 23, 24, 25, 26, 27, and 28 into the unit cell structure to analyze the radiation elements 21, 22, 23, 24, 25, 26, 27, and 28 to be designed.

The first simulation model 101 and the second simulation model 102 are modeled in a form where one main slot M and one sub-slot S are formed on one surface of the waveguide structure 110 having a predetermined length and a predetermined width and height.

The waveguide structure 110 of the first simulation model 101 and the second simulation model 102 corresponds to the waveguide 10 of the array antenna 1 to be designed, for example, the first branch portion 12 and the second branch portion 13 where the radiation elements 21, 22, 23, 24, 25, 26, 27, and 28 are formed.

The main slot M and sub-slot S of the first simulation model 101 and the second simulation model 102 correspond to the main slot M and sub-slot S of the radiation elements 21, 22, 23, 24, 25, 26, 27, and 28 to be designed.

The first simulation model 101 and the second simulation model 102 are used to calculate and derive the azimuth beam pattern and the elevation angle beam pattern emitted from the radiation elements 21, 22, 23, 24, 25, 26, 27, and 28 to be designed.

In this case, the first simulation model 101 and the second simulation model 102 may be modeled in a form in which the periphery is grounded. Since the radar on which the array antenna 1 or the waveguide 10 is mounted has various array antenna channels and a wide ground plane in actual implementation, it is preferable to apply the wide ground plane to the first simulation model 101 and the second simulation model 102 for analysis.

For example, a ground structure 130 corresponding to the ground plane as shown in FIG. 7 is modeled around the first simulation model 101. For reference, in FIG. 8, the ground structure 130 shown in FIG. 7 is omitted around the second simulation model 102.

The simulation models 101 and 102 are modeled in a form corresponding to the shape of each radiation element 21, 22, 23, 24, 25, 26, 27, and 28.

The first simulation model 101 has a shape in which the main slot M and the sub-slot S are located on the left and right sides with respect to the center line CL in the extension direction of the waveguide structure 110, respectively, as seen in FIG. 7.

The first simulation model 101 has a shape corresponding to the first arrangement form of the second radiation element 22, the fourth radiation element 24, the fifth radiation element 25, and the seventh radiation element 27 shown in FIG. 1.

Therefore, the first simulation model 101 is used to analyze the second radiation element 22, the fourth radiation element 24, the fifth radiation element 25, and the seventh radiation element 27 shown in FIG. 1.

The second simulation model 102 has a shape in which the main slot M and the sub-slot S are located to the right and left with respect to the center line CL in the extension direction of the waveguide structure 110, respectively, as seen in FIG. 8.

This second simulation model 102 has a form corresponding to the second arrangement form of the first radiation element 21, the third radiation element 23, the sixth radiation element 26, and the eighth radiation element 28 shown in FIG. 1.

Therefore, the second simulation model 102 may be used to analyze the first radiation element 21, the third radiation element 23, the sixth radiation element 26, and the eighth radiation element 28 shown in FIG. 1.

For reference, in the first simulation model 101 shown in FIG. 7, the offset distance of the main slot M may be determined to have a negative value, and the offset distance of the sub-slot S may be determined to have a positive value.

In addition, in the second simulation model 102 shown in FIG. 8, the offset distance of the main slot M may be determined to have a positive value, and the offset distance of the sub-slot S may be determined to have a negative value.

The length of the main slot M applied to the simulation models 101 and 102 is predetermined. That is, the length of the main slot M of each radiation element 21, 22, 23, 24, 25, 26, 27, and 28 at the beginning of design or before design is determined as half of the wavelength $\lambda_0$ of the electromagnetic wave radiated into the air from the main slot M or the radiation elements 21, 22, 23, 24, 25, 26, 27, and 28.

The wavelength $\lambda_0$ of the electromagnetic wave radiated into the air is determined by the operating frequency of the array antenna to be designed. The operating frequency of the array antenna 1 to be designed may be predetermined at the beginning of the design or before the design.

In step S130, the offset distance of the main slot M of each radiation element 21, 22, 23, 24, 25, 26, 27, and 28 applied to the simulation models 101, and 102 is set.

As described above, the radiated power ratio required for the radiation elements 21, 22, 23, 24, 25, 26, 27, and 28 is proportional to the offset distance of the main slot M constituting the radiation elements 21, 22, 23, 24, 25, 26, 27, and 28.

Therefore, the designer may set the offset distance of the main slot M applied to the simulation models 101, and 102 in response to the radiated power ratio required for each radiation element 21, 22, 23, 24, 25, 26, 27, and 28.

In step S140, the azimuth beam patterns are derived for the cases in which the offset distance and length of the sub-slot S of each radiation element 21, 22, 23, 24, 25, 26, 27, and 28 applied to the simulation model 101, and 102 are changed.

More specifically, when the offset distance of the sub-slot S and the length of the sub-slot S are changed for each radiation element 21, 22, 23, 24, 25, 26, 27, and 28, and applied to the simulation model, various cases are created in which the offset distance of the sub-slot S and the length of the sub-slot S are different.

The offset distance of the main slot M set in the previous step S120 is commonly applied to the various cases thus created.

In step S140, the offset distance of the sub-slot S and the length of the sub-slot S applied to the simulation models 101, and 102 may be changed by increasing to a predetermined size in a predetermined range.

For example, the offset distance of the sub-slot S may be changed in a manner that increases by 0.01 mm in the range of 0.1 to 0.9 mm and applied to the simulation model.

For reference, the offset distance of the sub-slot S applied according to the first simulation model 101 or the second simulation model 102 may have a positive or negative sign.

For example, the length of the sub-slot S may be changed in a manner that increases by 0.01 $\lambda_0$ in the range of 0.1 $\lambda_0$ to 0.9 $\lambda_0$ and applied to the simulation model. For reference, $\lambda_0$ means the wavelength of the electromagnetic wave emitted from the radiation elements 21, 22, 23, 24, 25, 26, 27, and 28 into the air.

As mentioned above, the azimuth beam pattern and even the elevation angle beam pattern for cases where the offset distance of the sub-slot S and the length of the sub-slot S are different may be derived, for example, by using a known electromagnetic wave full wave numerical analysis program.

Figure 9:
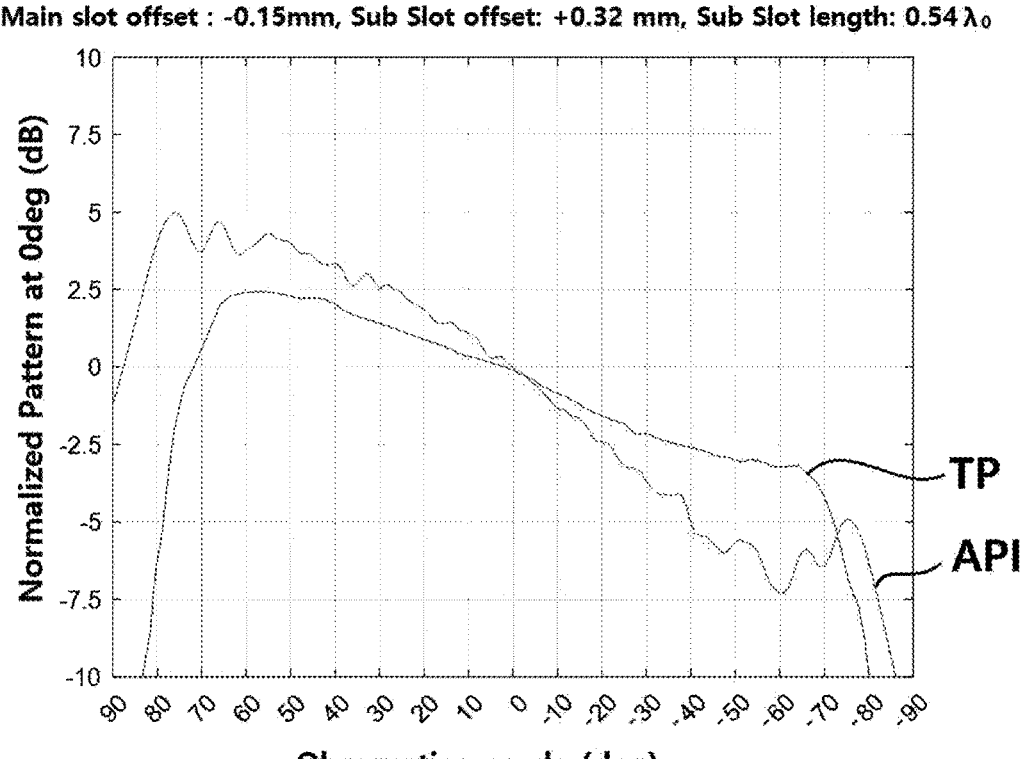
Figure 10:
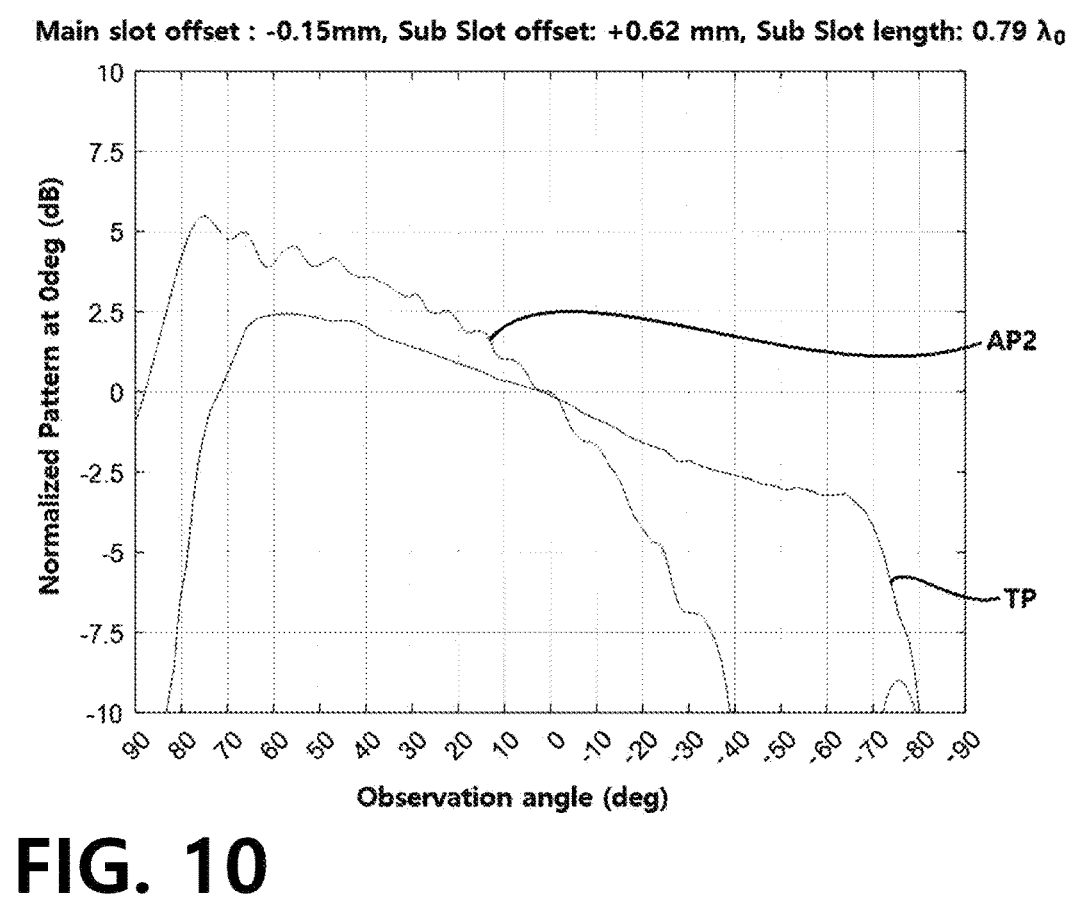
Figure 11:
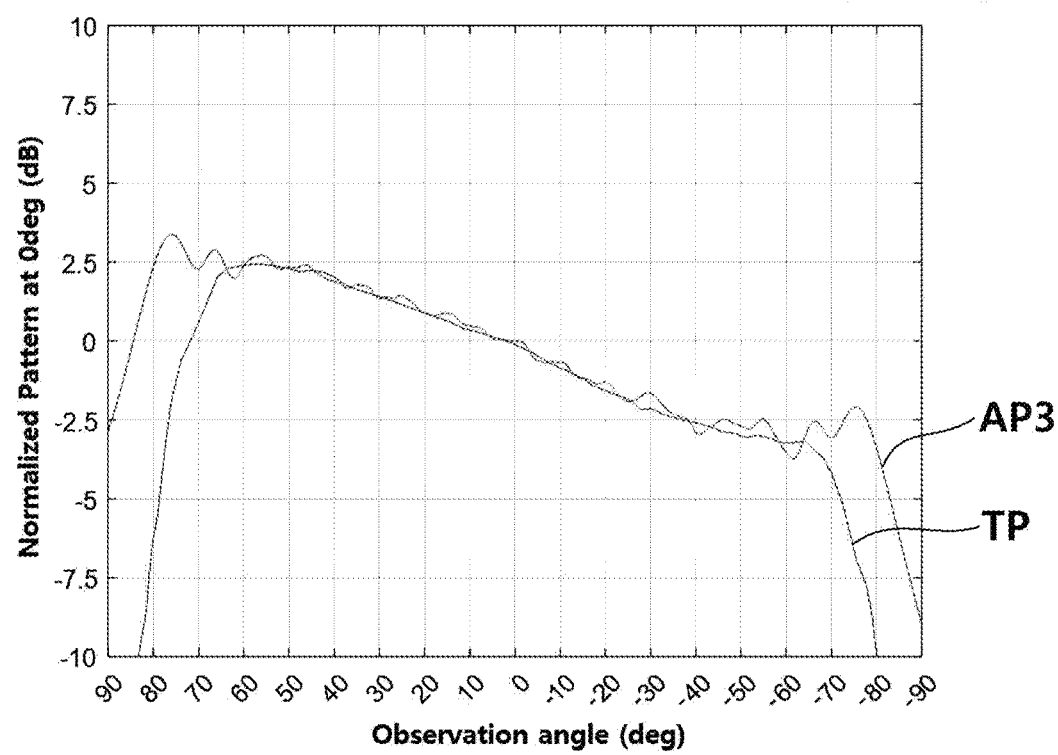

In this regard, FIGS. 9 to 11 are diagrams showing azimuth beam patterns of cases in which an offset distance of the sub-slot and a length of the sub-slot are different while an offset distance of the main slot is set as a specific value.

For reference, the horizontal axis of FIGS. 9 to 11 is expressed as an observation angle, but represents an azimuth angle, and the vertical axis represents a normalized gain based on the gain of the azimuth angle of 0°. In addition, FIGS. 9 to 11 are results performed based on the first simulation model 101 shown in FIG. 7. However, although not shown, it is also possible to derive similar results to FIGS. 9 to 11 based on the second simulation model 102 shown in FIG. 8.

In FIG. 9, an azimuth beam pattern AP1 for a case (hereinafter referred to as a first case) where the offset distance of the main slot M is −0.15 mm, the offset distance of the sub-slot S is +0.32 mm, and the length of the sub-slot S is 0.54 $\lambda_0$ is shown in contrast to the target azimuth beam pattern TP.

In FIG. 10, an azimuth beam pattern AP2 for a case (hereinafter referred to as a second case) where the offset distance of the main slot M is −0.15 mm, the offset distance of the sub-slot S is +0.62 mm, and the length of the sub-slot S is 0.79 $\lambda_0$ is shown in contrast to the target azimuth beam pattern TP.

In FIG. 11, an azimuth beam pattern AP3 for a case (hereinafter referred to as a third case) where the offset distance of the main slot M is −0.15 mm, the offset distance of the sub-slot S is +0.32 mm, and the length of the sub-slot S is 0.79 $\lambda_0$ is shown in contrast to the target azimuth beam pattern TP.

Referring to FIGS. 9 to 11, it may be seen that the azimuth beam pattern API of the first case, the azimuth beam pattern AP2 of the second case, and the azimuth beam pattern AP3 of the third case have different shapes.

Here, the target azimuth beam pattern TP is an azimuth beam pattern targeted by each radiation element 21, 22, 23, 24, 25, 26, 27, and 28 and has a gain curve having the highest gain at a specific angle among the azimuthal ranges and the gain decreasing in the remaining angle range. In this case, it may be said that the target azimuth beam pattern TP is inclined at a specific angle with the highest gain.

In this embodiment, the target azimuth beam pattern TP of each radiation element 21, 22, 23, 24, 25, 26, 27, and 28 is the same.

The target azimuth beam pattern TP may be determined according to the position of the corner where the antenna is installed (e.g., the front left corner, the front right corner, the rear left corner, the rear right corner, etc.) and the angle of the installation surface of the antenna with respect to the longitudinal direction of the vehicle.

For example, when the antenna is installed in the front left corner of the vehicle and the angle of the installation surface of the antenna with respect to the longitudinal direction of the vehicle is 60°, the target azimuth beam pattern may be inclined at +60°, as shown in FIGS. 9 to 11.

For example, when the antenna is installed in the front right corner of the vehicle and the angle of the installation surface of the antenna with respect to the longitudinal direction of the vehicle is 60°, although not shown, the target azimuth beam pattern may be inclined at −60°.

Although not shown, in addition to FIGS. 9 to 11, an azimuth beam pattern of various cases in which the offset distance of the main slot M is −0.15 mm and the offset distance and length of the sub-slot S are different may be derived.

Figure 12:
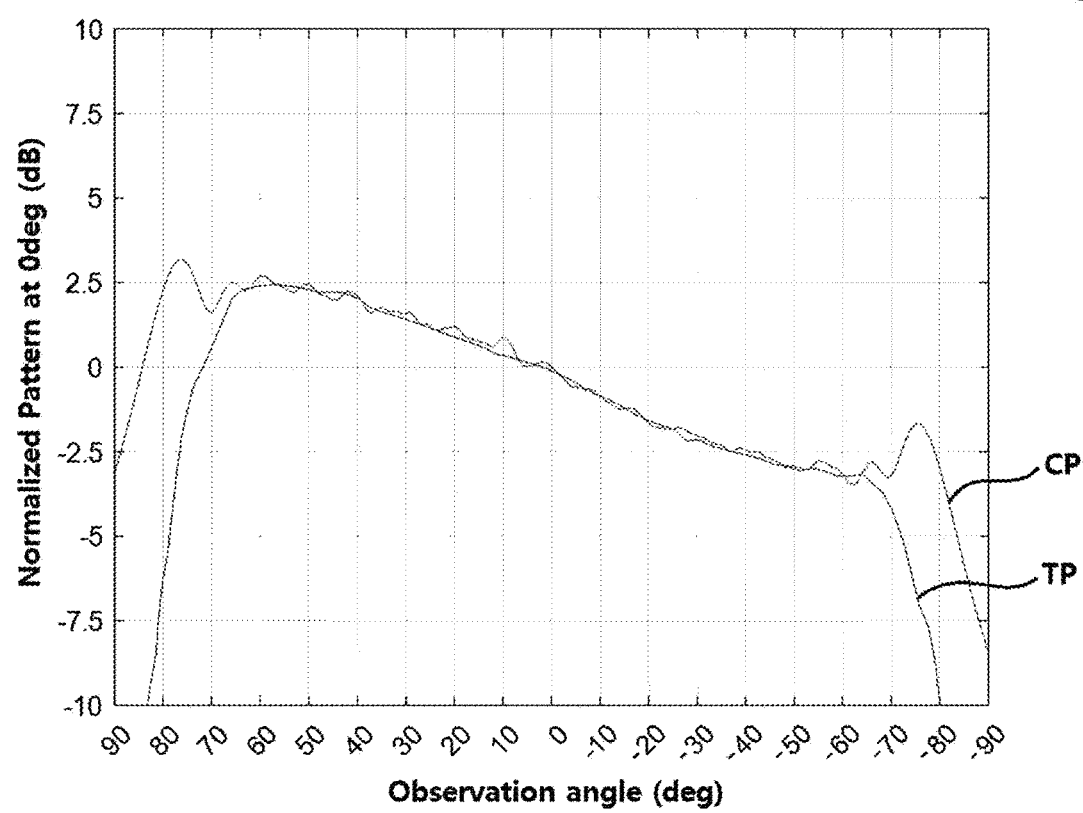
FIG. 12 is diagrams showing an azimuth beam pattern of cases in which an offset distance of the main slot is set to a specific value different from that of FIGS. 9 to 11, and an offset distance of the sub-slot and a length of the sub-slot are different.

Meanwhile, FIG. 12 is diagrams showing an azimuth beam pattern of cases in which an offset distance of the main slot is set to a specific value different from that of FIGS. 9 to 11, and an offset distance of the sub-slot and a length of the sub-slot are different.

For reference, the horizontal axis of FIG. 12 is expressed as an observation angle, but represents an azimuth angle, and the vertical axis represents a normalized gain based on the gain of the azimuth angle of 0°.

In FIG. 12, an azimuth beam pattern CP for a case where the offset distance of the main slot M is −0.55 mm, the offset distance of the sub-slot S is +0.16 mm, and the length of the sub-slot S is 0.56 $\lambda_0$ is shown in contrast to the target azimuth beam pattern TP.

Although not show, in addition to FIG. 12, an azimuth beam pattern of various cases in which the offset distance of the main slot M is −0.55 mm and the offset distance and length of the sub-slot S are different may be derived.

In step S150, a similar azimuth beam pattern similar to the target azimuth beam pattern is selected from among the azimuth beam patterns derived through step S140.

For example, a similar azimuth beam pattern may be selected using a root mean square error between the target azimuth beam pattern and the derived azimuth beam patterns.

More specifically, the step S150 may include a step S150-1 of calculating the root mean square error values of the derived azimuth beam patterns with respect to the target azimuth beam pattern, a step S150-2 of deriving a minimum value among the calculated root mean square error values, and a step S150-3 of selecting the azimuth beam pattern corresponding to the minimum value as the similar azimuth beam pattern similar to the target azimuth beam pattern when the minimum value is equal to or less than a set value, and returning to the step S140 when the minimum value exceeds the set value.

In step S150-1, the root mean square error values of the azimuth beam patterns derived through step S140 for the target azimuth beam pattern are calculated. In other words, the root mean square error values between the target azimuth beam pattern and the azimuth beam patterns derived through step S140 are calculated.

In step S150-2, a minimum value among the root mean square error values calculated through step S150-1 is derived. Here, the azimuth beam pattern corresponding to the minimum value means that the similarity with respect to the target azimuth beam pattern is relatively the highest among the entire azimuth beam patterns. In this sense, the fact that the root mean square error value should be a minimum value may be a primary condition for being selected as a similar azimuth beam pattern.

However, step S150-3 may be performed to ensure that the azimuth beam pattern corresponding to the minimum value is objectively sufficiently similar to the target azimuth beam pattern.

In step S150-3, when the minimum value derived through step S150-2 is less than or equal to the set value, the azimuth beam pattern corresponding to the minimum value is selected as a similar azimuth beam pattern similar to the target azimuth beam pattern.

Here, the condition that the minimum value derived through step S150-2 is less than or equal to the set value may be a secondary condition for being selected as a similar azimuth beam pattern.

When the minimum value is less than or equal to the set value, it may be determined that the azimuth beam pattern corresponding to the minimum value is sufficiently similar to the target azimuth beam pattern. For example, the set value compared to the minimum value may be 0.5, but is not limited thereto.

Figure 13:
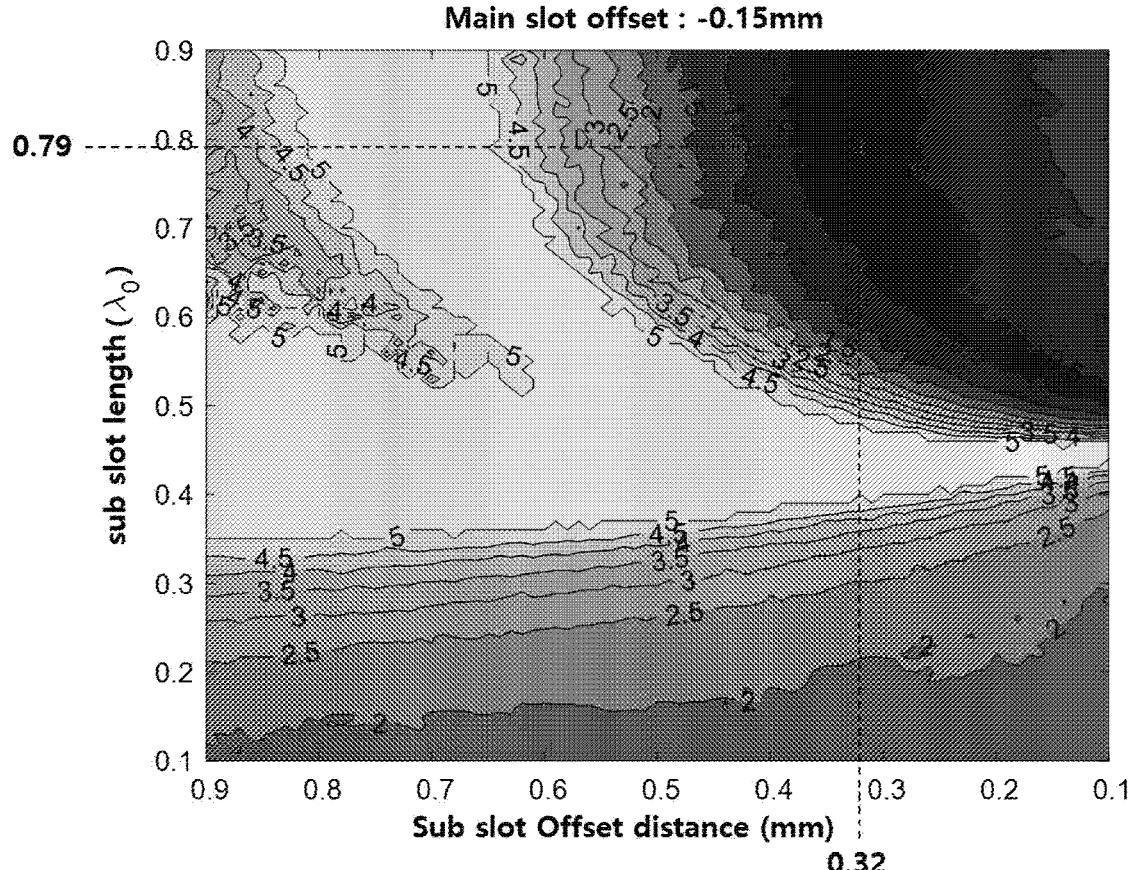
FIG. 13 is a diagram showing an example in which root mean square error value between the target azimuth beam pattern and the derived azimuth beam patterns are shown in a contour shape.

FIG. 13 is a diagram showing an example in which root mean square error value between the target azimuth beam pattern and the derived azimuth beam patterns are shown in a contour shape.

For reference, the graph shown in FIG. 13 is derived from cases in which the offset distance of the main slot M is set to −0.15 mm, which is a specific value, and in FIG. 13, the horizontal axis represents the offset distance of the sub-slot S, and the vertical axis represents the length of the sub-slot S.

Referring to FIG. 13, the asterisk (*) displayed on the graph is a point indicating the minimum value among the root mean square error values calculated through step S150-

1. It may be seen that the asterisk (*) is displayed in an area smaller than 0.5 when considering the surrounding contour lines. Therefore, the azimuth beam pattern corresponding to the asterisk (*) may be selected as a similar azimuth beam pattern by passing both the first condition and the second condition.

Through a separate program, the root mean square error values may be calculated, the graph as shown in FIG. 13 may be derived, and the minimum value among the calculated root mean square error values may be represented as the asterisk (*) on the graph.

For reference, in FIG. 13, it may be seen that the offset distance and the length of the sub-slot S applied to the case corresponding to the asterisk (*), that is, the case having the azimuth beam pattern corresponding to the minimum value, are +0.32 mm and 0.79 $\lambda_0$, respectively. These values are consistent with those of the third case, shown in FIG. 11. Through this, it may be seen that the azimuth beam pattern corresponding to the asterisk (*) in FIG. 13 is the azimuth beam pattern CP3 shown in FIG. 11.

Figure 14:
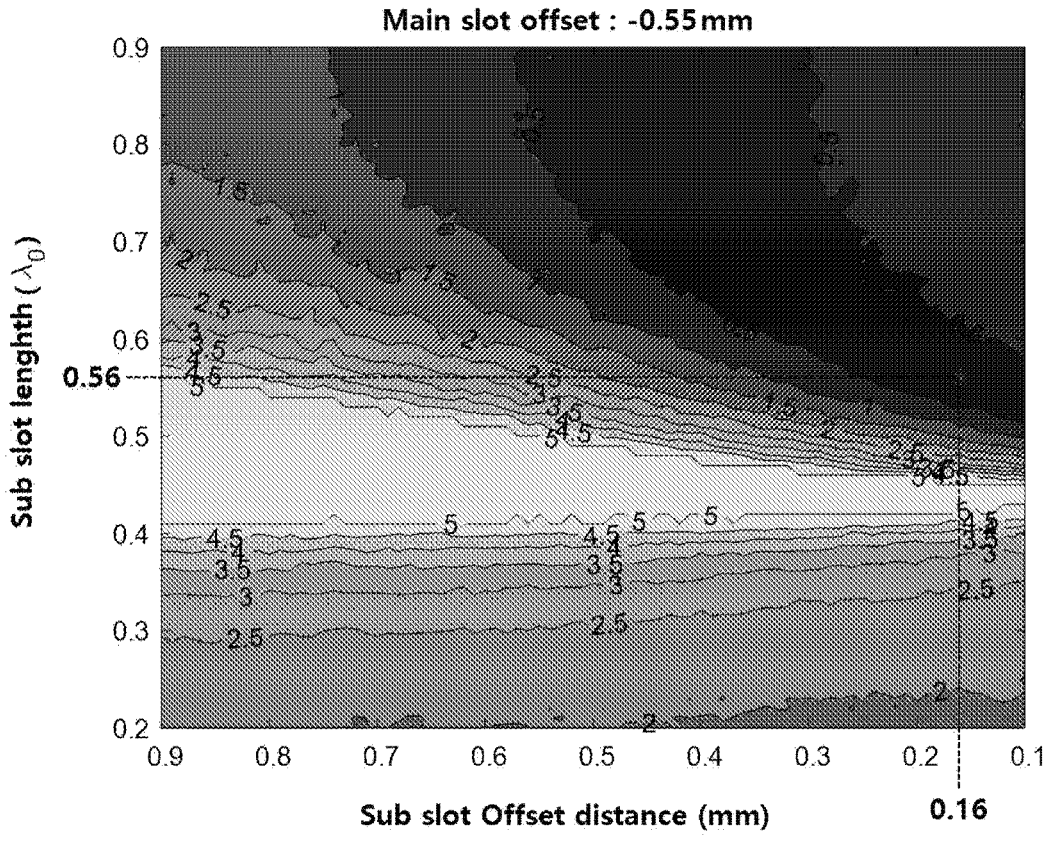
FIG. 14 is a diagram of another example showing the root mean square error between the target azimuth beam pattern and the derived azimuth beam patterns in the form of a contour line.

FIG. 14 is a diagram of another example showing the root mean square error between the target azimuth beam pattern and the derived azimuth beam patterns in the form of a contour line.

For reference, the graph shown in FIG. 14 is derived from cases in which the offset distance of the main slot M is set to −0.55 mm, which is a specific value, and in FIG. 14, the horizontal axis represents the offset distance of the sub-slot S, and the vertical axis represents the length of the sub-slot S.

Referring to FIG. 14, the asterisk (*) displayed on the graph is a point indicating the minimum value among the root mean square error values calculated through step S150-1. It may be seen that the asterisk (*) is displayed in an area smaller than 0.5 when considering the surrounding contour lines. Therefore, the azimuth beam pattern corresponding to the asterisk (*) may be selected as a similar azimuth beam pattern by passing both the first condition and the second condition.

For reference, in FIG. 14, it may be seen that the offset distance and the length of the sub-slot S applied to the case corresponding to the asterisk (*), that is, the case having the azimuth beam pattern corresponding to the minimum value, are +0.16 mm and 0.56 $\lambda_0$, respectively. These values are consistent with those of the third case, shown in FIG. 12. Through this, it may be seen that the azimuth beam pattern corresponding to the asterisk (*) in FIG. 14 is the azimuth beam pattern CP shown in FIG. 12.

In step S150-3, when the minimum value among the root mean square error values of the derived azimuth beam patterns for the target azimuth beam pattern exceeds the set value, it is determined that the azimuth beam pattern corresponding to the minimum value is not similar to the target azimuth beam pattern, and the process returns to step S140.

In the step S140 performed again due to returning, azimuth beam patterns are calculated for cases in which values different from the offset distance and length of the sub-slot S applied to the simulation model in the step S140 before the returning are applied to the simulation model. Thereafter, step S150 is performed again.

Returning to step S140 may be repeated until the similar azimuth beam pattern is selected in step S150, which is performed again.

In step S160, the radiated power ratio for the case corresponding to the similar azimuth beam pattern selected through step S150 is calculated.

Figure 15:
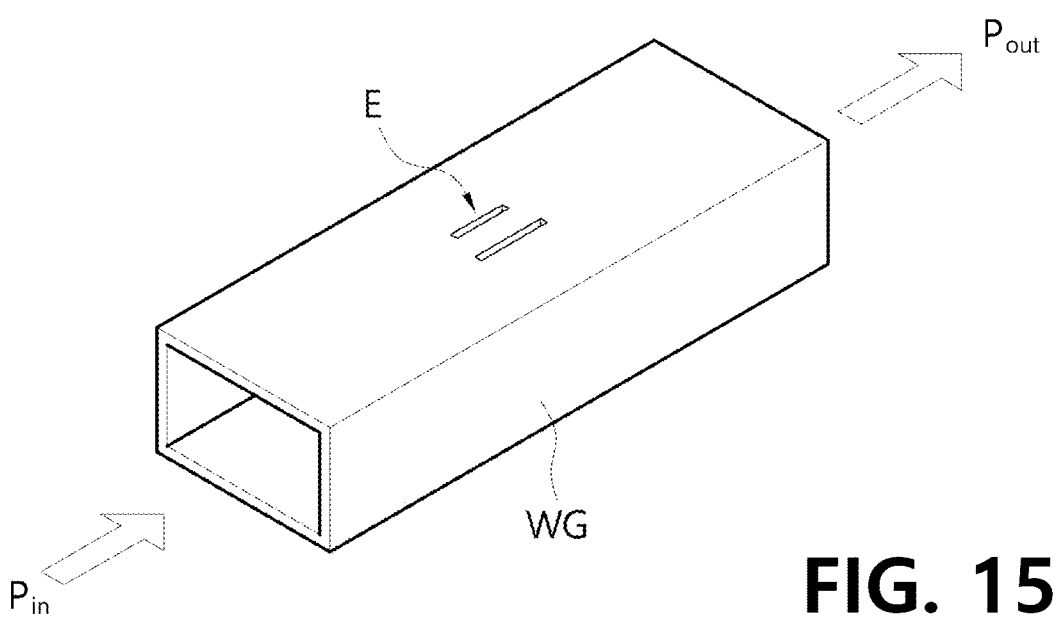
FIG. 15 is an exemplary diagram for explaining the calculation of the radiated power ratio for the radiation element having the double slot structure.

FIG. 15 is an exemplary diagram for explaining the calculation of the radiated power ratio for the radiation element having the double slot structure.

Referring to FIG. 15, the radiated power ratio is a value obtained by dividing the power $P_{radiated}$ emitted from the radiation element E by the power $P_{in}$ introduced into the waveguide WG, as shown in Equation (1) below, when it is assumed that one radiation element E having the double slot structure is formed in the waveguide WG. In other words, it represents the ratio of the power $P_{radiated}$ emitted from the radiation element E to the power $P_{in}$ introduced into the waveguide WG.

In addition, the power $P_{radiated}$ emitted from the radiation element E is a value obtained by subtracting the power Pout exiting the waveguide WG and the power $\zeta$ lost in the waveguide WG from the power $P_{in}$ introduced into the waveguide WG as shown in Equation (2).

$$\text{(Radiated Power } Radtio) = \frac{P_{radiated}}{R_{in}} \qquad \text{Equation (1)}$$

$$P_{radaited} = P_{in} - P_{out} - \zeta \qquad \text{Equation (2)}$$

For example, when the power $P_{in}$ introduced into the waveguide WG is 100 W and the power $P_{radiated}$ emitted from the radiation element E is 100 W, the radiated power ratio is 1. When the power $P_{in}$ introduced into the waveguide WG is 100 W and the power $P_{radiated}$ emitted from the radiation element E is 20 W, the radiated power ratio is 0.2. Of course, the radiated power ratio may be converted into a percentage.

The radiated power ratio for the case may be calculated based on the offset distance value of the main slot M, the offset distance value of the sub-slot S, and the length value of the sub-slot S, which are applied to the case corresponding to the similar azimuth beam pattern selected through step S150.

In step S170, the design value of each of the radiation elements 21, 22, 23, 24, 25, 26, 27, and 28 is determined by comparing the radiated power ratio calculated through step S160 with the radiated power ratio set through step S110.

More specifically, in step S170, when the difference between the radiated power ratio calculated through step S160 and the radiated power ratio set through step S110 is within the error range, the offset distance value of the main slot M, the offset distance value of the sub-slot S, and the length value of the sub-slot S, which are applied to the case corresponding to the similar azimuth beam pattern are determined as the design value of each of the radiation elements 21, 22, 23, 24, 25, 26, 27, and 28, and when the difference between the calculated radiated power ratio and the set radiated power ratio is out of the error range, the process returns to the step S130.

For example, the error range may be 0.001 or less, but is not limited thereto. However, when the radiated power ratio is converted into a percentage and applied, the error range may be 0.1% or less.

As an example, let us assume that the second radiation element 22 or the seventh radiation element 27 shown in FIG. 1 is designed.

In addition, through the steps S120 to S150, it is assumed that the azimuth beam pattern CP3 of the third case shown in FIG. 11 was selected as a similar azimuth beam pattern similar to the target azimuth beam pattern TP. And as a reference, the offset distance of the main slot M and the offset distance and the length of the sub-slot S applied to the third case of FIG. 11 are −0.15 mm, +0.32 mm, and 0.79 $\lambda_0$, respectively.

In addition, it is assumed that the radiated power ratio calculated through the step S160 is 0.049, and the radiated power ratio for the second radiation element 22 or the seventh radiation element 27 set through the step S110 is 0.049.

In this case, the difference between 0.049, which is the radiated power ratio calculated through step S160, and 0.049, which is the radiated power ratio set through step S110, is 0, which is less than or equal to 0.001 and is within the error range.

At this time, since the difference between the calculated radiated power ratio and the set radiated power ratio is within the error range in the step S170, the offset distance value of the main slot M applied to the third case of FIG. 11 may be determined to be −0.15 mm, the offset distance value of the sub-slot S may be determined to be +0.32 mm, and the length value of 0.79 $\lambda_0$ of the sub-slot S may be determined as the design value of the second radiation element 22 or the seventh radiation element 27.

As another example, it is assumed that the fourth radiation element 24 or the fifth radiation element 25 shown in FIG. 1 is designed.

In addition, through the steps S120 to S140, it is assumed that the azimuth beam pattern CP of the case shown in FIG. 12 was selected as a similar azimuth beam pattern similar to the target azimuth beam pattern TP. And as a reference, the offset distance of the main slot M and the offset distance and the length of the sub-slot S applied to the case of FIG. 12 are −0.55 mm, +0.16 mm, and 0.56 $\lambda_0$, respectively.

In addition, it is assumed that the radiated power ratio calculated through the step S160 is 0.1875, and the radiated power ratio for the fourth radiation element 24 or the fifth radiation element 25 set through the step S110 is 0.188.

In this case, in the step S170, the difference between 0.1875, which is the radiated power ratio calculated through step S160, and 0.188, which is the radiated power ratio set through step S110, is 0.0005, which is less than or equal to 0.001 and is within the error range.

At this time, since the difference between the calculated radiated power ratio and the set radiated power ratio is within the error range in the step S170, the offset distance value of the main slot M applied to the third case of FIG. 12 of −0.55 mm, the offset distance value of the sub-slot S of +0.16 mm, and the length value of the sub-slot S of 0.56 $\lambda_0$ may be determined as the design value of the fourth radiation element 24 or the fifth radiation element 25.

On the other hand, in the step S170, the difference between the radiated power ratio calculated through the step S160 and the radiated power ratio set through the step S110 is out of the error range, the process returns to the step S130.

In the step S130, performed again due to returning, a value different from the offset distance of the main slot M applied to the simulation model be set before the process in the step S130, and is applied to the simulation model.

Thereafter, the process is performed sequentially from the step S140 to the step S170. This process may be repeated until the design values of the radiation elements 21, 22, 23, 24, 25, 26, and 28 are determined in the re-performed step S170.

On the other hand, when the returning to step S130 is repeated a predetermined number of times until the design value of each radiation element 21, 22, 23, 24, 25, 26, 27, and 28 is determined in step S170, the offset distance of the main slot M applied in step S130, which is performed again for each returning, may be changed in a predetermined manner.

For example, in the step S130, which is performed again for each returning, the offset distance of the main slot M may be changed to a value increased by 0.05 mm from the offset distance value of the main slot M applied in the immediately preceding returning and may be applied to the simulation model.

More specifically, when the offset distance of the main slot M is set to 0.1 mm in the first performed step S130 and applied to the simulation model, in the step S130, which is performed again in the first returning through the step S170, the offset distance of the main slot M may be changed to 0.15 mm and applied to the simulation model, and in the step S130, which is performed again in the second returning through the step S170, the offset distance of the main slot M may be changed to 0.2 mm and applied to the simulation model. For example, the offset distance of the main slot M applied in the step S130 may be set within the range of 0.1 mm to 0.9 mm, but is not limited thereto.

For reference, the offset distance of the main slot applied according to the first simulation model 101 and the second simulation model 102 may have a positive or negative sign. When the double slot array antenna design method M1 according to the present embodiment is used as described above, it is possible to easily and effectively design an array antenna having a beam pattern similar to the target azimuth beam pattern desired by the designer and having a low level near a side lobe of the entire elevation angle beam pattern emitted from the radiation elements 21, 22, 23, 24, 25, 26, 27, and 28.

On the other hand, when the design value of each radiation element 21, 22, 23, 24, 25, 26, 27, and 28 is determined in the above step S160, the design value and the calculated radiated power ratio corresponding to the design value may be stored as a database.

As described above as an example in the step S170, the offset distance of the main slot M of −0.15 mm, the offset distance of the sub-slot S of +0.32 mm, and the length of the sub-slot S of 0.79 $\lambda_0$ may be determined as the design value of the second radiation element 22 or the seventh radiation element 27. In this case, the calculated radiated power ratio matched with the above design value may be 0.049.

As described above as another example in the step S170, the offset distance of the main slot M of −0.55 mm, the offset distance of the sub-slot S of +0.16 mm, and the length of the sub-slot S of 0.56 $\lambda_0$ may be determined as the design value of the fourth radiation element 24 or the fifth radiation element 25. In this case, the calculated radiated power ratio matched with the above design value may be 0.188.

These design values and the calculated radiated power ratios matching the design values may be derived and stored for each radiation element 21, 22, 23, 24, 25, 26, 27, and 28. These data may be gradually accumulated in the process of repeating the design method M1 according to the present embodiment.

On the other hand, in explaining the design method M1 according to the present embodiment, it is described that the waveguide of the array antenna to be designed has a T-shape of a center feeding method, but this is merely an example, and the idea of the present disclosure can be applied to the waveguide of an antenna having various types of feeding methods or the waveguide of an antenna having various shapes or structures.

Figure 16:
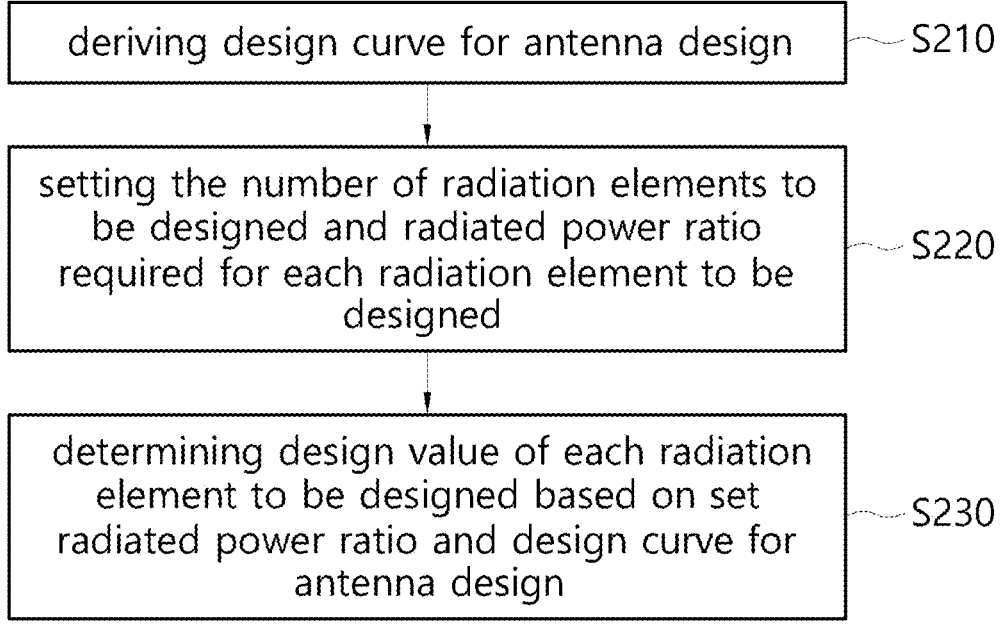
FIG. 16 is a flowchart of a method for designing a double slot array antenna according to another embodiment of the present disclosure.

FIG. 16 is a flowchart of a method for designing a double slot array antenna according to another embodiment of the present disclosure.

Referring to FIG. 16, the design method M2 according to this embodiment includes a step S210 of deriving a design curve for antenna design, a step S230 of setting the number of radiation elements to be designed in a double slot structure of the array antenna to be designed, and setting a radiated power ratio required for each radiation element to be designed, and a step S250 of determining a design value of each radiation element to be designed based on the radiated power ratio required for each radiation element to be designed and the design curve for antenna design.

In the step S210, the design curve for antenna design may be derived through the design method M1 according to the previous embodiment. That is, the design curve for antenna design may be derived based on the design value of each radiation element determined through the design method M1 according to the previous embodiment and the calculated radiated power ratio matched with the design value.

In more detail, the design values determined through the design method M1 according to the previous embodiment and the calculated radiated power ratios matched with the design values may be derived and stored for each radiation element. Based on the data on the calculated radiated power ratios matched with the stored design values and design values, the design curve for antenna design as shown in FIGS. 17 to 21 may be derived.

Figure 17:
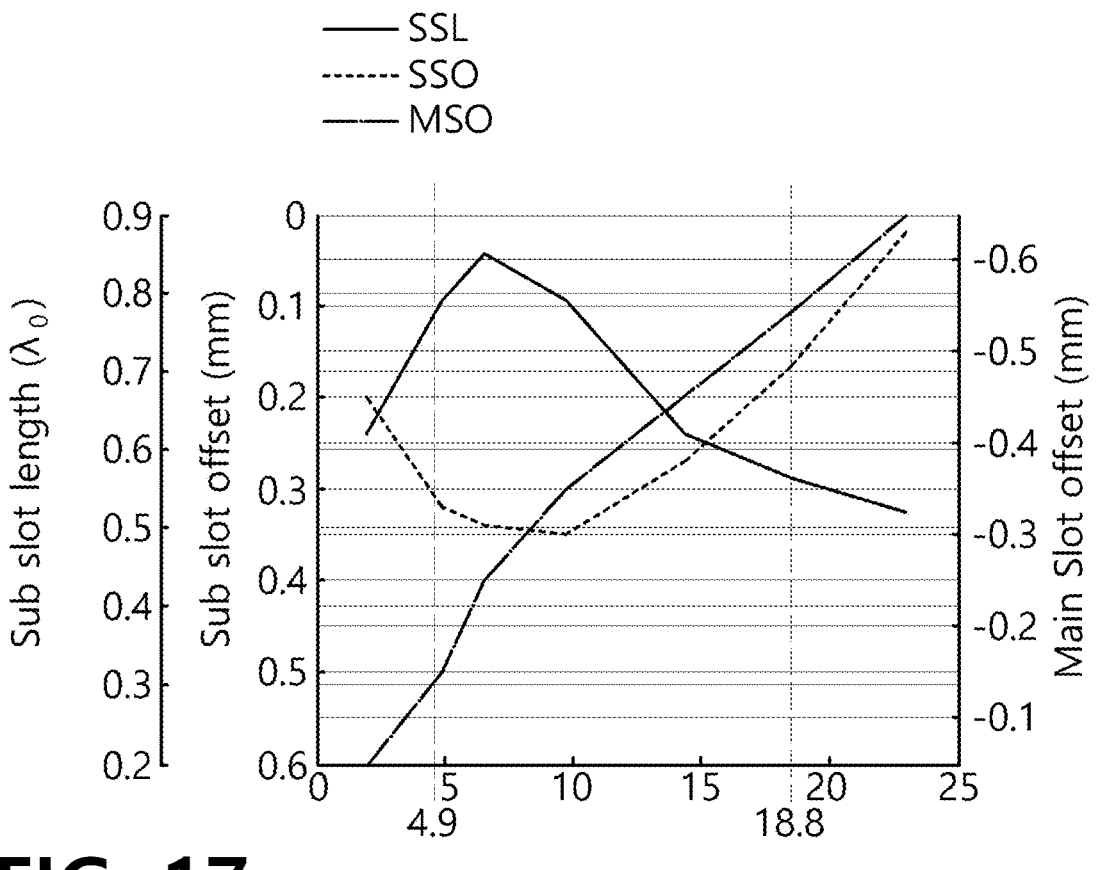
FIG. 17 is a diagram showing an example of a design curve for antenna design.
Figure 18:
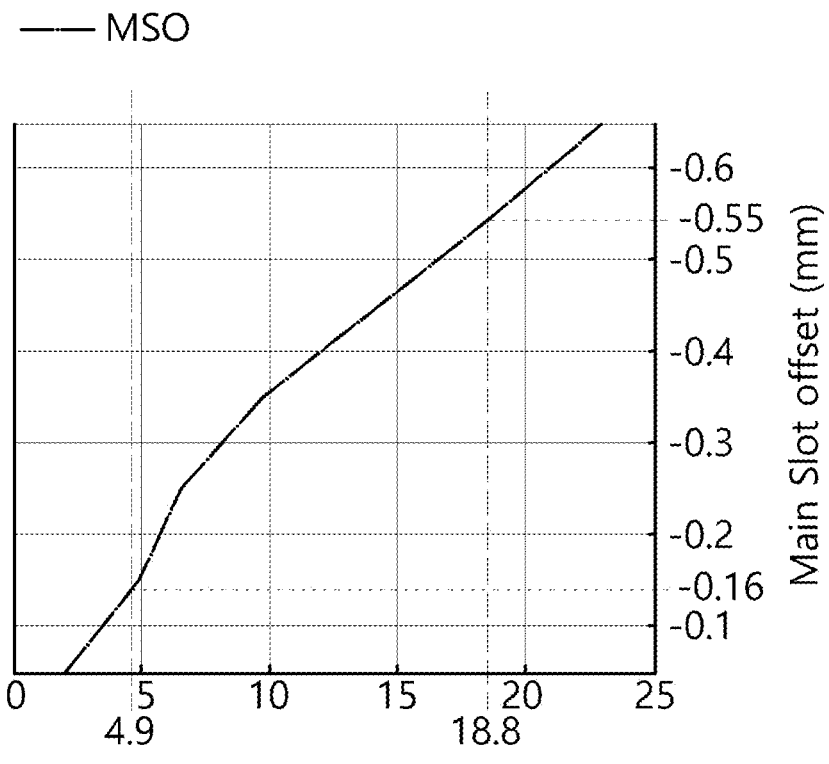
FIG. 18 is a diagram separately showing a part of the design curve for antenna design of FIG. 17.
Figure 19:
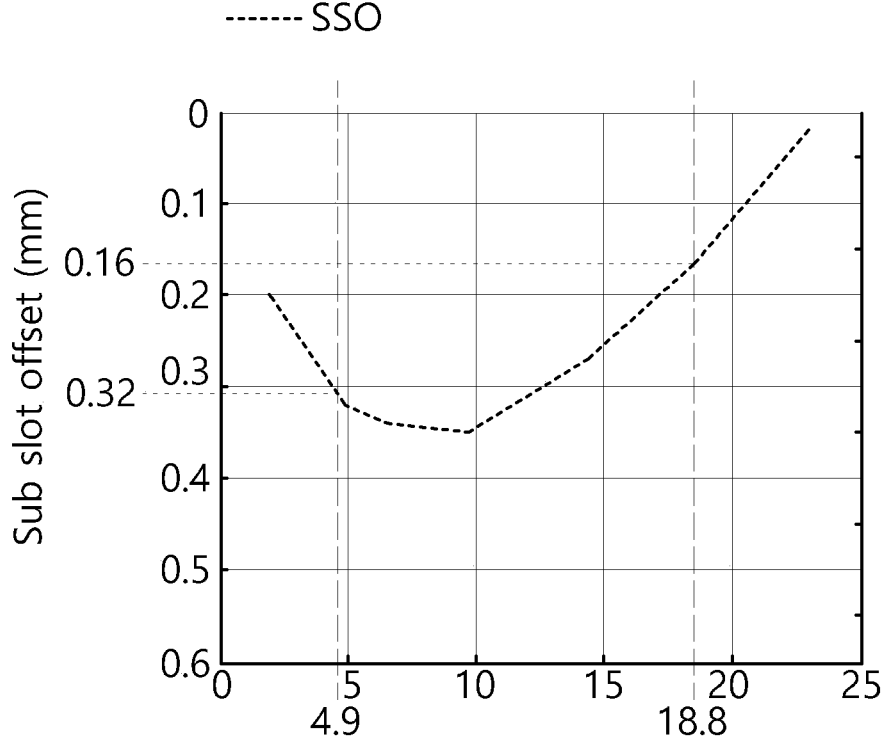
FIG. 19 is a diagram separately showing another part of the design curve for antenna design of FIG. 17.
Figure 20:
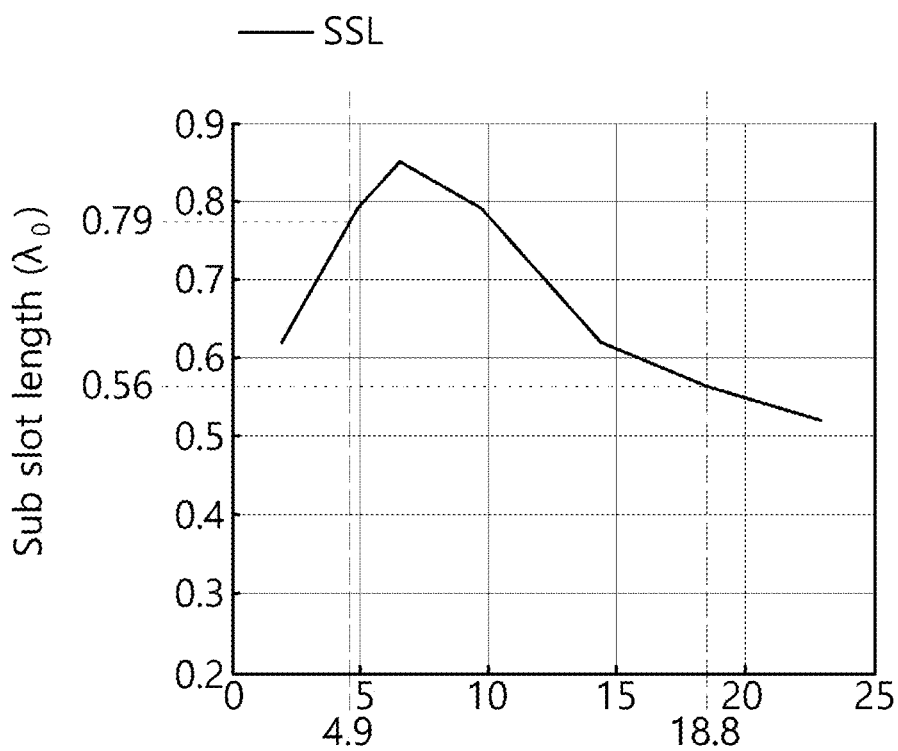
FIG. 20 is a diagram separately showing another part of the design curve for antenna design of FIG. 17.
Figure 21:
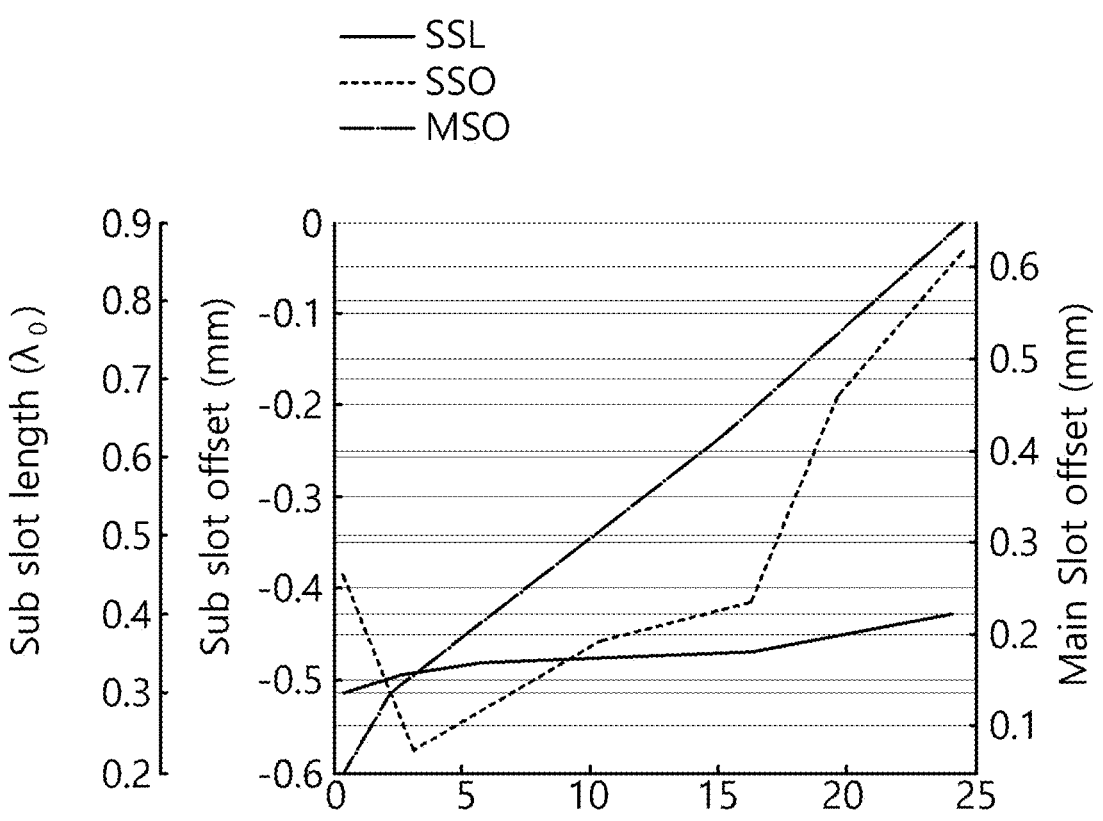
FIG. 21 is a diagram showing another example of a design curve for antenna design.

For reference, FIG. 17 is a diagram showing an example of a design curve for antenna design, FIG. 18 is a diagram separately showing a part of the design curve for antenna design of FIG. 17, FIG. 19 is a diagram separately showing another part of the design curve for antenna design of FIG. 17, FIG. 20 is a diagram separately showing another part of the design curve for antenna design of FIG. 17, and FIG. 21 is a diagram showing another example of a design curve for antenna design.

The design curve for antenna design shown in FIG. 17 is derived from radiation elements having a first arrangement form, such as the second radiation element 22, the fourth radiation element 24, the fifth radiation element 25, and the seventh radiation element 27 shown in FIG. 1, and the design curve for antenna design shown in FIG. 21 is derived from radiation elements having a second arrangement form, such as the first radiation element 21, the third radiation element 23, the sixth radiation element 26, and the eighth radiation element 28 shown in FIG. 1.

In FIGS. 17 to 21, the horizontal axis represents the radiated power ratio, in FIGS. 17 and 21, the vertical axis represents the offset distance of the main slot, the offset distance of the sub-slot, and the length of the sub-slot, in FIG. 18, the vertical axis represents the offset distance of the main slot, in FIG. 19, the vertical axis represents the offset distance of the sub-slot, and in FIG. 20, the vertical axis represents the length of the sub-slot.

The curve MSO shown in FIGS. 17, 18, and 21 is a curve showing the relationship between the radiated power ratio and the offset distance of the main slot, the curve SSO shown in FIGS. 17, 19, and 21 is a curve showing the relationship between the radiated power ratio and the offset distance of the sub-slot, and the curve SSL shown in FIGS. 17, 20, and 21 is a curve showing the relationship between the radiated power ratio and the length of the sub-slot.

In the step S230, the number of radiation elements to be designed in the double slot structure of the array antenna to be designed may be set. At this time, the number of radiation elements to be designed may be set between 4 and 50 when impedance matching is not applied, and there is no limit to the number when impedance matching is applied. The designer may set the radiated power ratio required for each radiation element to be designed so that the level of the side lobe of the entire elevation angle beam pattern emitted from the radiation elements to be designed is lowered.

In the step S250, the design value of each radiation element to be designed is determined based on the radiated power ratio required for each radiation element to be designed and the design curves MSO, SSO, and SSL for antenna design.

More specifically, in the step S250, the radiated power ratio required for each radiation element to be designed is substituted into the design curves MSO, SSO, and SSL for antenna design to determine the offset distance value of the matched main slot, the offset distance value of the sub-slot, and the length value of the sub-slot as the design value of the radiation element to be designed.

For example, in the step S250, when the radiation element to be designed has a first arrangement form such as the second radiation element 22 shown in FIG. 1, the design curves MSO, SSO, and SSL for antenna design shown in FIGS. 17 to 20 may be used. In this case, the radiated power ratio required for the radiation element to be designed may be set to 0.188 in the step S230.

In the step S250, the radiated power ratio set to 0.188 may be substituted into the design curves MSO, SSO, and SSL for antenna design shown in FIGS. 17 to 20, and the offset distance value of the main slot of −0.55 mm, the offset distance value of the sub-slot of +0.16 mm, and the length value of the sub-slot of 0.56 $\lambda_0$ matched to the radiated power ratio 0.188 may be determined as the design value of the radiation element to be designed.

As another example, in the step S250, when the radiation element to be designed has a first configuration such as the second radiation element 22 shown in FIG. 1, the design curves MSO, SSO, and SSL for antenna design shown in FIGS. 17 to 20 may be used. In this case, the radiated power ratio required for the radiation element to be designed may be set to 0.049 in the step S230.

In the step S250, the radiated power ratio set to 0.049 may be substituted into the design curves MSO, SSO, and SSL for antenna design shown in FIGS. 17 to 20, and the offset distance value of the main slot of −0.15 mm, the offset distance value of the sub-slot of +0.16 mm, and the length value of the sub-slot of 0.56 $\lambda_0$ matched to the radiated power ratio 0.049 may be determined as the design value of the radiation element to be designed.

Such a design method M2 has a beam pattern similar to a target azimuth beam pattern desired by a designer by using the design curves MSO, SSO, and SSL for antenna design, and may easily and effectively design an array antenna having a low level near a side lobe of the entire elevation angle beam pattern emitted from the radiation elements to be designed.

On the other hand, when the radiation element to be designed has a second arrangement form such as the first radiation element 21 shown in FIG. 1, the design curve for antenna design shown in FIG. 21 may be used.

In this case, the design may be performed in the same process as the radiation element to be designed is designed using the previous FIGS. 17 to 20.

Figure 22:
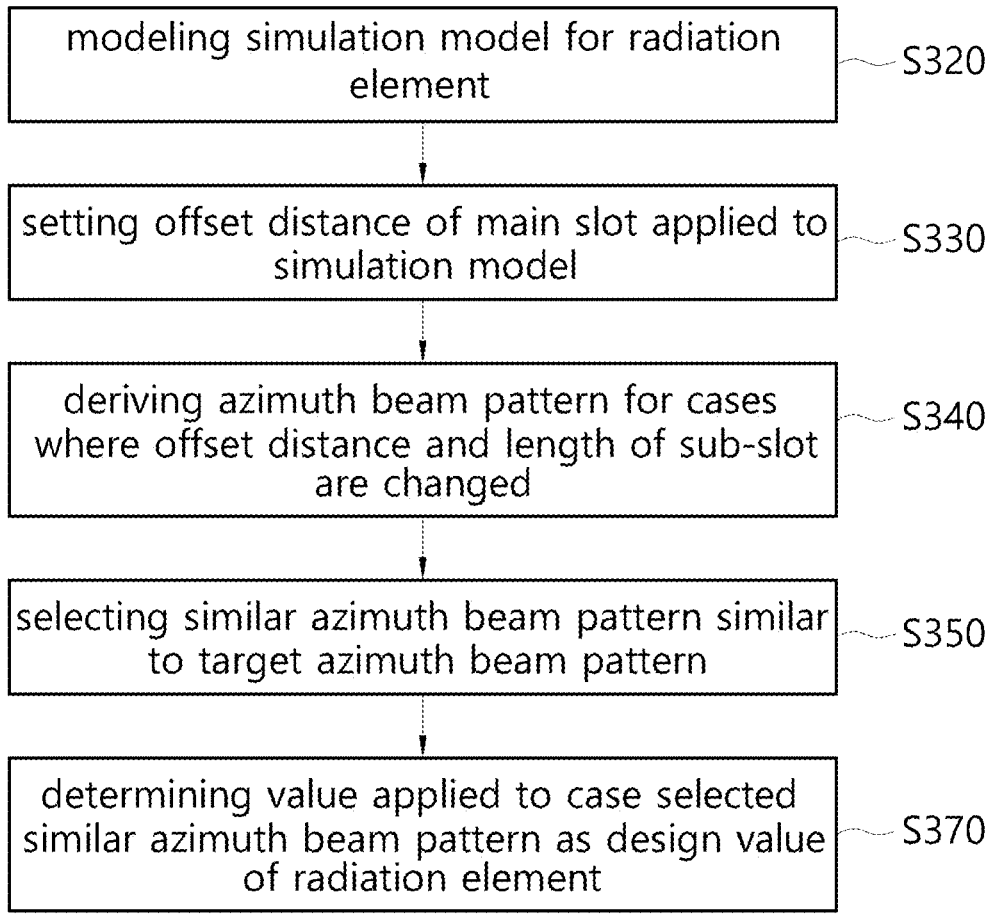
FIG. 22 is a flowchart of the double slot array antenna design method according to another embodiment of the present disclosure.

FIG. 22 is a flowchart of the double slot array antenna design method according to another embodiment of the present disclosure.

Referring to FIG. 22, the double slot array antenna design method M3 according to the present embodiment includes a step S320 of modeling a simulation model having a unit cell structure for a radiation element of an array antenna to be designed, a step S330 of setting an offset distance of a main slot of the radiation element applied to the simulation model, a step S340 of deriving an azimuth beam pattern for cases where an offset distance and a length of a sub-slot of the radiation element applied to the simulation model are changed, a step S350 of selecting a similar azimuth beam pattern similar to a target azimuth beam pattern among the derived azimuth beam patterns, and a step S360 of determining an offset distance value of the main slot, an offset distance value of the sub-slot, and a length value of the sub-slot applied to a case selected by the similar azimuth beam pattern as a design value of the radiation element.

Here, the steps S320, S330, S340, and S350 are substantially the same as the steps S120, S130, S140, and S150 of the design method M1 according to the previous embodiment, and the descriptions of the steps S120, S130, S140, and S150 are substituted.

In the step S360, the offset distance value of the main slot, the offset distance value of the sub-slot, and the length value of the sub-slot applied to a case selected by the similar azimuth beam pattern through the step S350 are determined as the design value of the radiation element.

For example, when the offset distance of the main slot applied to the case selected as the similar azimuth beam pattern is −0.15 mm, the offset distance of the sub-slot is +0.32 mm, and the length of the sub-slot is 0.79 $\lambda_0$, the offset distance value of the main slot of −0.15 mm, the offset distance value of the sub-slot of +0.32 mm, and the length value of the sub-slot of 0.79 $\lambda_0$ may be determined as a design value of the radiation element.

The design method M3 may easily and effectively design a radiation element having a beam pattern similar to a target azimuth beam pattern desired by the designer, as well as an array antenna in which the radiation elements are arranged.

Meanwhile, the double slot array antenna designed by the design method M1, M2, and M3 according to the previous embodiment may have a beam pattern similar to the azimuth beam pattern desired by the designer or generate a beam having a low level near the side lobe of the entire elevation angle beam pattern emitted from the radiation elements.

Although the embodiments of the present disclosure have been described above, the spirit of the present disclosure is not limited by the embodiments presented in this specification, and those skilled in the art understanding the spirit of the present disclosure may easily propose other embodiments by adding, modifying, deleting, and adding components within the same spirit, but it will be also within the spirit of the present disclosure.

LIST OF REFERENCE SIGNS

1: array antenna
10: waveguide
11: central portion
12: first branch portion
13: second branch portion
21: first radiation element
22: second radiation element
23: third radiation element
24: fourth radiation element
25: fifth radiation element
26: sixth radiation element
27: seventh radiation element
28: eighth radiation element
101: first simulation model 102: second simulation model
110: waveguide structure
130: ground structure
M: main slot,
S: sub-slot

What is claimed is:

1. A method for designing a double slot array antenna, comprising:
   a) setting the number of radiation elements of a double slot structure arranged in a waveguide of an array antenna to be designed, and setting a radiated power ratio required for each of the radiation elements;
   (b) modeling a simulation model for each of the radiation elements;
   (c) setting an offset distance of a main slot of each of the radiation elements applied to the simulation model;
   (d) deriving azimuth beam patterns for cases in which an offset distance and a length of a sub-slot of each of the radiation elements applied to the simulation model are changed;
   (e) selecting a similar azimuth beam pattern similar to a target azimuth beam pattern among the derived azimuth beam patterns;
   (f) calculating a radiated power ratio for the case corresponding to the similar azimuth beam pattern; and
   (g) comparing the calculated radiated power ratio with the set radiated power ratio to determine a design value of each of the radiation elements.

2. The method of claim 1, wherein a length of the main slot applied to the simulation model is determined as half of the wavelength of an electromagnetic wave radiated into air.

3. The method of claim 1, wherein the main slot and the sub-slot of each of the radiation elements are disposed in a first region and a second region facing each other with a center line in an extension direction of the waveguide interposed, respectively, or are disposed in the second region and the first region.

4. The method of claim 3, wherein the simulation model for each of the radiation elements is modeled in response to an arrangement form between the main slot and the sub-slot of each of the radiation elements.

5. The method of claim 1, wherein in the step (b), the simulation model is modeled in a form in which the periphery is grounded.

6. The method of claim 1, wherein in the step (e), the similar azimuth beam pattern is selected by using a root mean square error between the target azimuth beam pattern and the derived azimuth beam patterns.

7. The method of claim 6, wherein the step (e) comprises:
   calculating root mean square error values of the derived azimuth beam patterns with respect to the target azimuth beam pattern;
   deriving a minimum value among the calculated root mean square error values; and
   selecting the azimuth beam pattern corresponding to the minimum value as the similar azimuth beam pattern when the minimum value is equal to or less than a set value, and returning to the step (d) when the minimum value exceeds the set value.

8. The method of claim 7, wherein the set value is 0.5.

9. The method of claim 1, wherein in the step (g), when a difference between the calculated radiated power ratio and the set radiated power ratio is within an error range, an offset distance value of the main slot, an offset distance value of the sub-slot, and a length value of the sub-slot applied to the case corresponding to the similar azimuth beam pattern are determined as a design value of each of the radiation elements, and returning to the step (c) when the difference between the calculated radiated power ratio and the set radiated power ratio is out of the error range.

10. The method of claim 9, wherein the error range is 0.001 or less.

11. A method for designing a double slot array antenna, comprising:

(J) deriving a design curve for antenna design;

(K) setting the number of radiation elements to be designed having a double slot structure of an array antenna to be designed, and setting a radiated power ratio required for each radiation element to be designed; and (L) determining a design value of each radiation element to be designed based on the set radiated power ratio and the design curve for antenna design, wherein the design curve for antenna design is derived based on data acquired through the design method according to claim 1.

12. The method of claim 11, wherein in the step (L), the radiated power ratio required for each radiation element to be designed is substituted into the design curve for antenna design, and the matched offset distance value of the main slot, the offset distance value of the sub slot, and the length value of the sub slot are determined as the design value of each radiation element to be designed.

13. A double slot array antenna designed by the design method according to claim 1.

* * * * *